United States Patent
Ito et al.

(10) Patent No.: US 12,461,443 B2
(45) Date of Patent: Nov. 4, 2025

(54) PHOTORESIST RESIN, METHOD FOR PRODUCING PHOTORESIST RESIN, PHOTORESIST RESIN COMPOSITION, AND METHOD FOR FORMING PATTERN

(71) Applicant: DAICEL CORPORATION, Osaka (JP)

(72) Inventors: Akinori Ito, Tokyo (JP); Akira Eguchi, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 819 days.

(21) Appl. No.: 17/624,205

(22) PCT Filed: Jun. 18, 2020

(86) PCT No.: PCT/JP2020/023972
§ 371 (c)(1),
(2) Date: Dec. 30, 2021

(87) PCT Pub. No.: WO2021/002212
PCT Pub. Date: Jan. 7, 2021

(65) Prior Publication Data
US 2022/0372188 A1 Nov. 24, 2022

(30) Foreign Application Priority Data
Jul. 1, 2019 (JP) ................................. 2019-122971

(51) Int. Cl.
*G03F 7/004* (2006.01)
*C08F 2/38* (2006.01)
*C08F 220/18* (2006.01)
*C08F 220/20* (2006.01)
*C08F 220/28* (2006.01)

(52) U.S. Cl.
CPC ............... *G03F 7/004* (2013.01); *C08F 2/38* (2013.01); *C08F 220/1811* (2020.02); *C08F 220/1818* (2020.02); *C08F 220/20* (2013.01); *C08F 220/283* (2020.02)

(58) Field of Classification Search
CPC ...... G03F 7/0387; G03F 7/004; C08F 220/20; C08F 220/283
See application file for complete search history.

(56) References Cited

U.S. PATENT DOCUMENTS

| | | | |
|---|---|---|---|
| 7,407,733 B2 | 8/2008 | Koyama et al. | |
| 2006/0281022 A1 | 12/2006 | Koyama et al. | |
| 2012/0135350 A1* | 5/2012 | Kobayashi | G03F 7/0397 430/326 |
| 2012/0135357 A1* | 5/2012 | Kobayashi | G03F 7/0045 430/326 |
| 2012/0258402 A1* | 10/2012 | Sato | G03F 7/0045 560/220 |
| 2013/0023638 A1 | 1/2013 | Furukawa et al. | |
| 2013/0260312 A1* | 10/2013 | Suzuki | G03F 7/0045 524/547 |
| 2015/0168831 A1* | 6/2015 | Nishimura | C08F 220/1806 430/319 |
| 2017/0285469 A1* | 10/2017 | Nagamine | G03F 7/2006 |
| 2020/0110337 A1 | 4/2020 | Tanigaki et al. | |
| 2021/0040253 A1* | 2/2021 | Ito | G03F 7/038 |

FOREIGN PATENT DOCUMENTS

| | | |
|---|---|---|
| EP | 1 676 869 A1 | 7/2006 |
| JP | 2004-269855 A | 9/2004 |
| JP | 2004-355023 A | 12/2004 |
| JP | 2005-60511 A | 3/2005 |
| JP | 2005-120157 A | 5/2005 |
| JP | 2006-36894 A | 2/2006 |
| JP | 2008-50483 A | 3/2008 |
| JP | 2011-213773 A | 10/2011 |
| JP | 2013-36034 A | 2/2013 |
| JP | 5363844 B2 | 12/2013 |
| WO | WO 2018/181311 A1 | 10/2018 |

OTHER PUBLICATIONS

Chinese Office Action and Search Report for corresponding Chinese Application No. 202080048192.7, dated Feb. 23, 2024.
International Preliminary Report on Patentability and English translation of the Written Opinion of the International Searching Authority (Forms PCT/IB/373 and PCT/ISA/237) for International Application No. PCT/JP2020/023972, dated Dec. 28, 2021.
International Search Report (Form PCT/ISA/210) for International Application No. PCT/JP2020/023972, dated Sep. 15, 2020, with English translation.
Japanese Office Action for counterpart Japanese Application No. 2021-529952, dated May 21, 2024, with English translation.

* cited by examiner

*Primary Examiner* — Amanda C. Walke
(74) *Attorney, Agent, or Firm* — Birch, Stewart, Kolasch & Birch, LLP

(57) ABSTRACT

Provided is a resin that exhibits high resist performance because a poorly soluble component with respect to a resist solvent is reduced, and a production method for the resin. Disclosed is a photoresist resin containing an acrylic resin, in which when the photoresist resin is dissolved in propylene glycol monomethyl ether acetate in such a way that a resin solid content concentration is 5 wt %, a polystyrene equivalent turbidity measured using a method described in "Drinking Water Testing Methods" of Japan Water Works Association of 2003, Ministry of Health, Labor and Welfare Ordinance No. 261 of Japan is 30 or less.

8 Claims, No Drawings

PHOTORESIST RESIN, METHOD FOR PRODUCING PHOTORESIST RESIN, PHOTORESIST RESIN COMPOSITION, AND METHOD FOR FORMING PATTERN

TECHNICAL FIELD

The present invention relates to monomers, resins, resin compositions, and a pattern forming method. The present application claims priority to JP 2019-122971 filed in Japan on Jul. 1, 2019, the contents of which are incorporated herein.

BACKGROUND ART

In the manufacturing of semiconductors, significant innovations are being made in lithographic techniques for pattern formation. Initially, the i-line and g-line were used for exposure in lithography, and pattern line widths were wide, and therefore the capacity of semiconductors that were produced was low. However, recent developments in technology have enabled the use of a KrF excimer laser of a short wavelength and an ArF excimer laser of an even shorter wavelength, and the pattern line width is rapidly reduced.

For exposure using a KrF excimer laser, a novolac or styrene-based resin has been used, but the resin contains an aromatic group, and causes a problem of absorption of the laser light from the ArF excimer laser. Therefore, for exposure using an ArF excimer laser, a resin that does not contain an aromatic group (e.g., a resin having an alicyclic skeleton) is used instead of a resin that contains an aromatic group. The resins that are used for exposure using an ArF excimer laser are mainly acrylic resins. The use of such resins is motivated by application of the following mechanism: when a resin composition that contains: an acrylic resin containing a (meth)acrylic acid protected by a protecting group as a monomer unit, and a radiation-sensitive acid generating agent, is used, an acid generated by the exposure eliminates the protecting group to form a carboxyl group, and thus the resin becomes soluble in an alkaline solution.

As a method of producing an acrylic resin, a radical polymerization method using a monomer containing a (meth)acrylate compound, a radical polymerization initiator, and as necessary, a chain transfer agent is generally used. Examples of such a polymerization method known in the art include the following dropwise polymerization methods (Patent Documents 1 and 2).

(1) Method of preheating and adding dropwise a monomer (2) Method of adding dropwise a monomer into a polymerization solvent maintained at a constant temperature

CITATION LIST

Patent Document

Patent Document 1: JP 2004-269855 A
Patent Document 2: JP 2004-355023 A

SUMMARY OF INVENTION

Technical Problem

However, in the known dropwise polymerization method, an acrylic resin having a molecular weight larger than that of the target resin tends to be obtained. This is thought to be due to an unreacted monomer remaining in a reaction system even after the completion of a polymerization reaction in the dropwise polymerization method. In other words, it is conceived that, after the completion of the polymerization reaction, the produced resin and the unreacted monomer polymerize over time, resulting in an increase in molecular weight of the resin.

Generally, as the molecular weight of the resin increases, it becomes difficult to dissolve the resin in a resist solvent. For example, when the content of a poorly soluble resin (i.e., resin having a large molecular weight) in the acrylic resin increases, turbidity of a resin solution increases when the resin is dissolved in the resist solvent. In addition to the molecular weight, various properties such as a molecular weight distribution of the resin are considered to be a cause of improving poorly soluble properties with respect to the resist solvent. The present inventors discovered that resist performance of the resin deteriorates when the turbidity indicates a certain value.

Therefore, an object of the present invention is to provide a resin having high solubility in a resist solvent to exhibit good resist performance and a method of producing the resin. Another object of the present invention is to provide a composition containing a resin exhibiting high resist performance. Yet another object of the present invention is to provide a method that can form a fine pattern with good precision by using the composition.

Solution to Problem

As a result of diligent research to achieve the object described above, the inventors of the present invention have found that by adding a specific polymerization inhibitor to a reaction solution after a polymerization step using a dropwise polymerization method, polymerization of a resin obtained and an unreacted monomer is suppressed, and a resin having high solubility in a resist solvent can be obtained. The present invention was completed based on these findings.

That is, the present invention provides a photoresist resin composed of an acrylic resin, in which when the photoresist resin is dissolved in propylene glycol monomethyl ether acetate in such a way that a resin solid content concentration is 5 wt %, a polystyrene equivalent turbidity measured using a method described in "Drinking Water Testing Methods" of Japan Water Works Association of 2003, Ministry of Health, Labor and Welfare Ordinance No. 261 of Japan is 30 or less.

The resin preferably contains at least one polymerization unit selected from the group consisting of polymerization units represented by Formulas (a1) to (a4) below:

[Chem. 1]

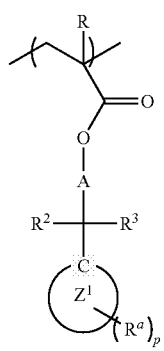

(a1)

-continued (a2)
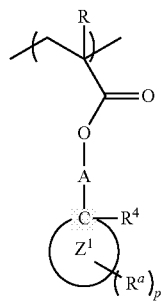

(a3)
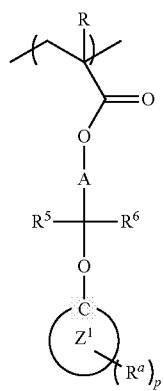

(a4)
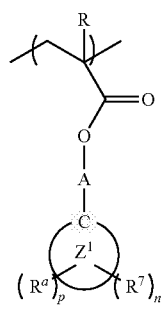

where R represents a hydrogen atom, a halogen atom, or an alkyl group that has from 1 to 6 carbon atoms and may have a halogen atom; A represents a single bond or a linking group; $R^2$ to $R^4$ are the same or different and represent an alkyl group that has from 1 to 6 carbon atoms and may have a substituent; $R^2$ and $R^3$ may be bonded to each other to form a ring; $R^5$ and $R^6$ are the same or different and represent an alkyl group that has from 1 to 6 carbon atoms and may have a hydrogen atom or a substituent; $R^7$ represents a —COOR$^c$ group, and the $R^c$ represents a tertiary hydrocarbon group that may have a substituent, a tetrahydrofuranyl group, a tetrahydropyranyl group, or an oxepanyl group; n represents an integer from 1 to 3; $R^a$ represents a substituent bonded to a ring $Z^1$, and each $R^a$ is the same or different and represents an oxo group, an alkyl group, a hydroxy group that may be protected with a protecting group, a hydroxy alkyl group that may be protected with a protecting group, or a carboxy group that may be protected with a protecting group; p represents an integer from 0 to 3; and the ring $Z^1$ represents an alicyclic hydrocarbon ring having from 3 to 20 carbon atoms.

The resin preferably contains at least one polymerization unit selected from the group consisting of polymerization units represented by Formulas (b1) to (b5) below:

[Chem. 2]

(b1)
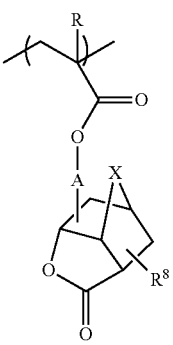

(b2)
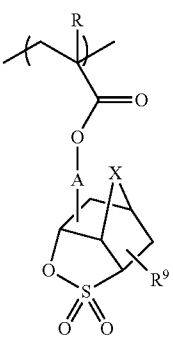

(b3)
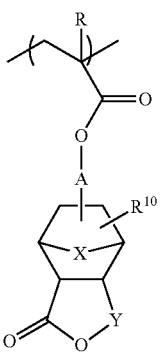

(b4)
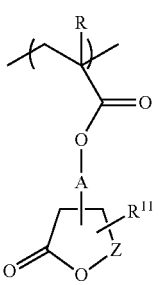

-continued (b5)

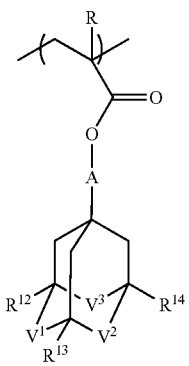

where R represents a hydrogen atom, a halogen atom, or an alkyl group that has from 1 to 6 carbon atoms and may have a halogen atom; A represents a single bond or a linking group; X represents no bond, a methylene group, an ethylene group, an oxygen atom, or a sulfur atom; Y represents a methylene group or a carbonyl group; Z represents a divalent organic group; $V^1$ to $V^3$ are the same or different and represent —$CH_2$—, [—C(=O)—], or [—C(=O)—O—] with the proviso that at least one of $V^1$ to $V^3$ is [—C(=O)—O—]; and $R^8$ to $R^{14}$ are the same or different and represent a hydrogen atom, a fluorine atom, an alkyl group that may have a fluorine atom, a hydroxy group that may be protected with a protecting group, a hydroxyalkyl group that may be protected with a protecting group, a carboxy group that may be protected with a protecting group, or a cyano group.

The resin preferably contains a polymerization unit represented by Formula (c1) below:

[Chem. 3]

(c1)

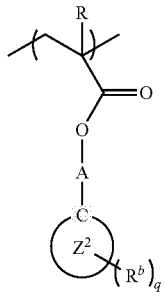

where R represents a hydrogen atom, a halogen atom, or an alkyl group that has from 1 to 6 carbon atoms and may have a halogen atom; A represents a single bond or a linking group; $R^b$ represents a hydroxy group that may be protected with a protecting group, a hydroxyalkyl group that may be protected with a protecting group, a carboxy group that may be protected with a protecting group, or a cyano group; q represents an integer from 1 to 5; and a ring $Z^2$ represents an alicyclic hydrocarbon ring having from 6 to 20 carbon atoms.

The present invention also provides a production method for the photoresist resin, the production method including adding dropwise a monomer or a solution containing the monomer in the presence of a polymerization initiator to polymerize the monomer, and adding a polymerization inhibitor of 10 ppm or greater to a resin solid content contained in a reaction solution after the polymerization step.

The polymerization inhibitor is preferably at least one selected from the group consisting of hydroquinones, phenols, benzoquinones, and the like, and N-oxyl compounds.

The present invention also provides a resin composition containing at least the resin and a radiation-sensitive acid generating agent.

The present invention also provides a pattern forming method including at least applying the composition to a substrate to form a coating film, exposing the coating film, and then subjecting the coating film to alkali dissolution.

Advantageous Effects of Invention

The resin of an embodiment of the present invention exhibits high resist performance because a poorly soluble component with respect to a resist solvent is reduced. Since the composition of an embodiment of the present invention contains the resin in which the poorly soluble component with respect to the resist solvent is reduced, high resist performance can be exhibited, and a fine pattern can be formed with good precision by using the composition.

DESCRIPTION OF EMBODIMENTS (Resin)

A resin of an embodiment of the present invention is an acrylic resin, and the resin is a photoresist resin characterized in that when the photoresist resin is dissolved in propylene glycol monomethyl ether acetate in such a way that a resin solid content concentration is 5 wt %, a polystyrene equivalent turbidity (hereinafter, may be simply referred to as "turbidity") measured using a method described in "Drinking Water Testing Methods" of Japan Water Works Association of 2003, Ministry of Health, Labor and Welfare Ordinance No. 261 of Japan is 30 or less.

The turbidity in the resin of an embodiment of the present invention is not particularly limited as long as it is 30 or less, and is, for example, preferably 20 or less, more preferably 10 or less, even more preferably 5 or less, and particularly preferably 3 or less.

The acrylic resin is defined as a homopolymer or a copolymer containing an acrylic monomer as an essential component. That is, the acrylic resin is a polymer containing a constituent unit derived from an acrylic monomer as an essential constituent unit.

The resin of an embodiment of the present invention may have a group (sometimes referred to as an "acid-degradable group") which undergoes elimination of a portion thereof by the action of an acid to form a polar group. As a result, the resin of an embodiment of the present invention increases its polarity due to the action of the acid, and the solubility in an alkaline developing solution increases.

Examples of the polar group include phenolic a hydroxyl group, a carboxy group, a fluorinated alcohol group (preferably a hexafluoroisopropanol group), a sulfonic acid group, a sulfonamide group, a sulfonylimide group, a (alkylsulfonyl) (alkylcarbonyl) methylene group, an (alkylsulfonyl) (alkylcarbonyl) imide group; a bis(alkylcarbonyl) methylene group, a bis(alkylcarbonyl) imide group, a bis(alkylsulfonyl) methylene group, a bis(alkylsulfonyl) imide group, a tris(alkylcarbonyl) methylene group, a tris (alkylsulfonyl) methylene group, and other such acidic groups, and alcoholic hydroxyl groups. Among them, carboxy groups, fluorinated alcohol groups (preferably a hexafluoroisopropanol group), and sulfonate groups are preferred.

The acid-degradable group is preferably a group in which a hydrogen atom of the polar group has been substituted with a group to be eliminated by an acid. Examples of the acid-degradable group include —C(R$^I$)(R$^{II}$)(R$^{III}$) and —C(R$^{IV}$)(R$^V$)(OR$^{VI}$). In the above formula, R$^I$ to R$^{III}$, and R$^{VI}$ each independently represent an alkyl group, a cycloalkyl group, an aryl group, an aralkyl group, or an alkenyl group. R$^{IV}$ and R$^V$ each independently represent a hydrogen atom, an alkyl group, a cycloalkyl group, an aryl group, an aralkyl group, or an alkenyl group. At least two groups of R$^I$ to R$^{III}$ may be bonded to each other to form a ring. Additionally, the R$^{IV}$ and R$^V$ may be bonded to each other to form a ring.

The number of carbon atoms in the acid-degradable group is not particularly limited, but, for example, is preferably 4 or more, and more preferably 5 or more. The upper limit of the number of carbon atoms is not particularly limited, but is preferably 20.

The alkyl group of the R$^I$ to R$^{VI}$ is preferably an alkyl group having from 1 to 8 carbon atoms, and examples thereof include a methyl group, an ethyl group, a propyl group, an n-butyl group, a s-butyl group, a t-butyl group, a hexyl group, and an octyl group.

The cycloalkyl group of the R$^I$ to R$^{VI}$ may be a monocyclic hydrocarbon group or a polycyclic (bridged cyclic) hydrocarbon group. The monocyclic hydrocarbon group is preferably a cycloalkyl group having from 3 to 8 carbon atoms, and examples thereof include a cyclopropyl group, a cyclobutyl group, a cyclopentyl group, a cyclohexyl group, and a cyclooctyl group. The polycyclic hydrocarbon group is preferably a cycloalkyl group having from 6 to 20 carbon atoms, and examples include an adamantyl group, a norbornyl group, an isoboronyl group, a camphanyl group, a dicyclopentyl group, an α-pinel group, a tricyclodecanyl group, a tetracyclododecyl group, and an androstanyl group. At least one carbon atom in the cycloalkyl group may be substituted with a hetero atom, such as an oxygen atom.

The aryl group of the R$^I$ to R$^{VI}$ is preferably an aryl group having from 6 to 14 carbon atoms, and examples thereof include a phenyl group, a naphthyl group, and an anthryl group.

The aralkyl group of the R$^I$ to R$^{VI}$ is preferably an aralkyl group having from 7 to 12 carbon atoms, and examples thereof include a benzyl group, a phenethyl group, and a naphthylmethyl group.

The alkenyl group of the R$^I$ to R$^{VI}$ is preferably an alkenyl group having from 2 to 8 carbon atoms, and examples thereof include a vinyl group, an allyl group, a butenyl group, and a cyclohexenyl group.

A ring formed by the at least two groups of the R$^I$ to R$^{III}$ bonded to each other, and a ring formed by R$^{IV}$ and R$^V$ bonded to each other are preferably a cycloalkane ring. Examples of the cycloalkane ring include monocyclic cycloalkane rings, such as a cyclopropane ring, a cyclobutane ring, a cyclopentane ring, and a cyclohexane ring; and polycyclic cycloalkane rings, such as a norbornane ring, a tricyclodecane ring, a tetracyclododecane ring, and an adamantane ring.

The alkyl group, the cycloalkyl group, the aryl group, the aralkyl group, the alkenyl group, and the cycloalkane ring in R$^I$ to R$^{VI}$ may each have a substituent.

The acid-degradable group is preferably, among others, a t-butyl group, t-amyl group, and groups represented by Formulas (I) to (IV) below.

[Chem. 4]

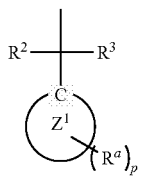
(I)

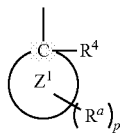
(II)

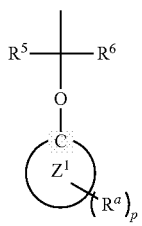
(III)

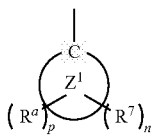
(IV)

R$^2$ to R$^7$, R$^a$, n, p, and a ring Z$^1$ in Formulas (I) to (IV) above are respectively the same as R$^2$ to R$^7$, R$^a$, n, p, and a ring Z$^1$ in Formulas (a1) to (a4) described later.

The acid-degradable group may be provided via a spacer. The spacer is the same as a linking group exemplified and described as A in Formula (1) described later.

The resin of an embodiment of the present invention preferably contains an acid-degradable group, as a polymerization unit having an acid-degradable group. Examples of the polymerization unit having such an acid-decomposable group include a polymerization unit represented by Formula (1) below.

[Chem. 5]

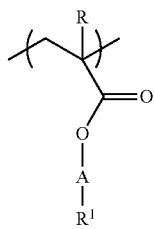
(1)

In Formula (1) above, R$^I$ represents the acid-degradable group. In Formula (1) above, R represents a hydrogen atom, a halogen atom, or an alkyl group that has from 1 to 6 carbon atoms and may have a halogen atom. Examples of the halogen atom include a chlorine atom, a bromine atom, and an iodine atom. Examples of the alkyl group having from 1 to 6 carbon atoms include a methyl group, an ethyl group, a propyl group, an isopropyl group, an n-butyl group, an iso-butyl group, a s-butyl group, a t-butyl group, a pentyl group, an isoamyl group, a s-amyl group, a t-amyl group, and a hexyl group. Examples of the alkyl group having from 1 to 6 carbon atoms and having a halogen atom include a group (halo ($C_{1-6}$) alkyl group) in which one or two or more of hydrogen atoms constituting the alkyl group have been substituted with halogen atoms, such as trifluoromethyl and 2,2,2-trifluoroethyl groups.

In Formula (1) above, A represents a single bond or a linking group. Examples of the linking group include a carbonyl group (—C(=O)—), an ether bond (—O—), an ester bond (—C(=O)—O—), an amide bond (—C(O)—NH—), a carbonate bond (—O—C(=O)—O—), a group in which a plurality of these groups are linked, and a group in which an alkylene group and these groups are bonded. Examples of the alkylene group include linear or branched alkylene groups, such as a methylene group, a methylmethylene group, a dimethylmethylene group, an ethylene group, a propylene group, and a trimethylene group; and divalent alicyclic hydrocarbon groups (in particular, divalent cycloalkylene groups), such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group.

Among the polymerization units represented by Formula (1) above, the resin of an embodiment of the present invention preferably contains at least one polymerization unit selected from the group consisting of polymerization units represented by Formulas (a1) to (a4). Note that the "at least one polymerization unit selected from the group consisting of polymerization units represented by Formulas (a1) to (a4)" may be referred to as a "monomer unit a".

[Chem. 6]

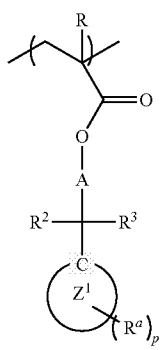

(a1)

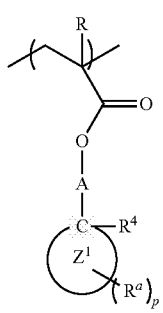

(a2)

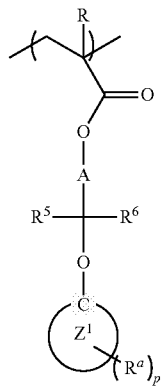

(a3)

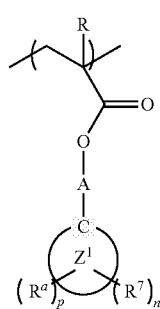

(a4)

In the polymerization units represented by Formulas (a1) to (a4) above, similar to the R in Formula (1), R represents a hydrogen atom, a halogen atom, or an alkyl group that has from 1 to 6 carbon atoms and may have a halogen atom, and A represents a single bond or a linking group. A in Formulas (a1) to (a4) above is preferably, among others, a single bond, and a group in which an alkylene group and a carbonyloxy group are bonded (alkylene-carbonyloxy group). $R^2$ to $R^4$ are the same or different and represent an alkyl group that has from 1 to 6 carbon atoms and may have a substituent. Note that $R^2$ and $R^3$ may be bonded to each other to form a ring. $R^5$ and $R^6$ are the same or different and represent an alkyl group that has from 1 to 6 carbon atoms and may have a hydrogen atom or a substituent. $R^7$ represents a —COOR$^c$ group, and the RC represents a tertiary hydrocarbon group that may have a substituent, a tetrahydrofuranyl group, a tetrahydropyranyl group, or an oxepanyl group. n represents an integer of 1 to 3. When n is 2 or 3, the multiple $R^7$ may each be the same or different. $R^a$ represents a substituent bonded to a ring $Z^1$, and each $R^a$ is the same or different and represents an oxo group, an alkyl group, a hydroxy group that may be protected with a protecting group, a hydroxyalkyl group that may be protected with a protecting group, or a carboxy group that may be protected with a protecting group. p represents an integer from 0 to 3. A ring $Z^1$ represents an alicyclic hydrocarbon ring having from 3 to 20 carbon atoms. When p is 2 or 3, the multiple $R^a$ may each be the same or different.

Examples of the alkyl group in the $R^a$ include alkyl groups having from 1 to 6 carbon atoms, such as a methyl group, an ethyl group, a propyl group, an isopropyl group, an n-butyl group, a s-butyl group, a t-butyl group, a pentyl group, an isoamyl group, a s-amyl group, a t-amyl group, and n-hexyl group.

Examples of the hydroxyalkyl group in the $R^a$ include hydroxy $C_{1-6}$ alkyl groups, such as a hydroxymethyl group, a 2-hydroxyethyl group, a 1-hydroxyethyl group, a 3-hydroxypropyl group, a 2-hydroxypropyl group, a 4-hydroxybutyl group, and a 6-hydroxyhexyl group.

Examples of the protecting group that the hydroxy group and the hydroxyalkyl group in the $R^a$ may have include $C_{1-4}$ alkyl groups, such as a methyl group, an ethyl group, and a t-butyl group; a group that forms an acetal bond together with an oxygen atom constituting the hydroxy group (e.g., $C_{1-4}$ alkyl-O—$C_{1-4}$ alkyl groups, such as a methoxymethyl group); a group that forms an ester bond together with the oxygen atom constituting the hydroxy group (e.g., such as an acetyl group and a benzoyl group).

Examples of the protecting group of the carboxy group in the $R^a$ include $C_{1-6}$ alkyl groups, such as a methyl group, an ethyl group, a propyl group, an isopropyl group, an n-butyl group, a s-butyl group, a t-butyl group, a pentyl group, an isoamyl group, a s-amyl group, a t-amyl group, and a hexyl group; a 2-tetrahydrofuranyl group; a 2-tetrahydropyranyl group; and a 2-oxepanyl group.

Examples of the alkyl group having from 1 to 6 carbon atoms in the $R^2$ to $R^6$ include linear or branched alkyl groups, such as a methyl group, an ethyl group, a propyl group, an isopropyl group, an n-butyl group, an iso-butyl group, a s-butyl group, a t-butyl group, a pentyl group, an isoamyl group, a s-amyl group, a t-amyl group, and a hexyl group. Among these, $C_{1-4}$ alkyl groups are preferable, $C_{1-3}$ alkyl groups are more preferable, and $C_{1-2}$ alkyl groups are even more preferable.

Examples of the substituent that the alkyl group having from 1 to 6 carbon atoms in the $R^2$ to $R^6$ may have include a halogen atom, a hydroxy group, a substituted hydroxy group (e.g., such as a $C_{1-4}$ alkoxy group, such as a methoxy group, an ethoxy group, and a propoxy group), and a cyano group. Examples of the alkyl group having from 1 to 6 carbon atoms and having a substituent include a halo ($C_{1-6}$) alkyl group in which one or two or more of hydrogen atoms constituting the alkyl group have been substituted with halogen atoms, such as a trifluoromethyl group and a 2,2,2-trifluoroethyl group; a hydroxymethyl group, a 2-hydroxyethyl group, a methoxymethyl group, a 2-methoxyethyl group, an ethoxymethyl group, a 2-ethoxyethyl group, a cyanomethyl group, and a 2-cyanoethyl group.

When the $R^2$ and $R^3$ are bonded to each other to form a ring, examples of the ring include alicyclic hydrocarbon rings that have from 3 to 12 carbon atoms and may have a substituent.

Examples of the tertiary hydrocarbon group in the $R^c$ include a t-butyl group and a t-amyl group.

Examples of the substituent that the tertiary hydrocarbon group in the $R^c$ may have include a halogen atom, a hydroxy group, a substituted hydroxy group (e.g., such as a $C_{1-4}$ alkoxy group, such as a methoxy group, an ethoxy group, and a propoxy group), and a cyano group.

Examples of the alicyclic hydrocarbon ring having from 3 to 20 carbon atoms in the ring $Z^1$ include monocyclic alicyclic hydrocarbon rings; such as approximately 3- to 20-membered (preferably 3- to 15-membered and particularly preferably 5- to 12-membered) cycloalkane rings, such as a cyclopropane ring, a cyclobutane ring, a cyclopentane ring, a cyclohexane ring, and a cyclooctane ring; and approximately 3- to 20-membered (preferably 3- to 15-membered and particularly preferably 5- to 10-membered) cycloalkene rings, such as a cyclopropene ring, a cyclobutene ring, a cyclopentene ring, and a cyclohexene ring; an adamantane ring; rings containing a norbornane ring or a norbornene ring, such as a norbornane ring, a norbornene ring, a bornane ring, an isobornane ring, a tricyclo [5.2.1.0$^{2,6}$] decane ring, and a tetracyclo [4.4.0.1$^{2,5}$.1$^{7,10}$] dodecane ring; a ring in which a polycyclic aromatic fused ring has been hydrogenated (preferably a fully hydrogenated ring), such as a perhydroindene ring, a decalin ring (perhydronaphthalene ring), a perhydrofluorene ring (a tricyclo [7.4.0.0$^{3,8}$] tridecane ring), and a perhydroanthracene ring; approximately from bicyclic to hexacyclic bridged hydrocarbon rings, such as bridged hydrocarbon rings of bicyclic system, tricyclic system, tetracyclic system, etc. (e.g., bridged cyclic hydrocarbon rings having approximately from 6 to 20 carbon atoms), such as a tricyclo[4.2.2.1$^{2,5}$] undecane ring.

Specific examples of the monomer unit a include monomer units represented by the following formulas. In the monomer units represented by the following formulas, $R^d$ represents a methyl group or a hydrogen atom, and $R^e$ represents a methyl group or a hydrogen atom. In addition, the bonding position of the $R^e$ to the alicyclic hydrocarbon ring is not particularly limited, and one or a plurality of $R^e$s may be bonded to any carbon atom of the carbon atoms constituting the alicyclic hydrocarbon ring. When a monomer unit represented by the following formulas includes two or more $R^e$, the two or more $R^e$ may each be the same or different. The monomer unit a can be introduced into the resin by polymerizing the corresponding unsaturated carboxylate.

[Chem. 7]

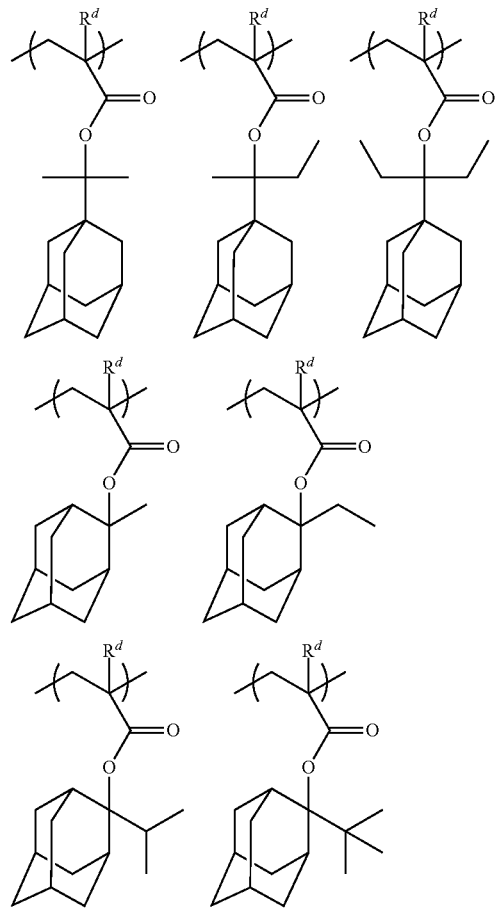

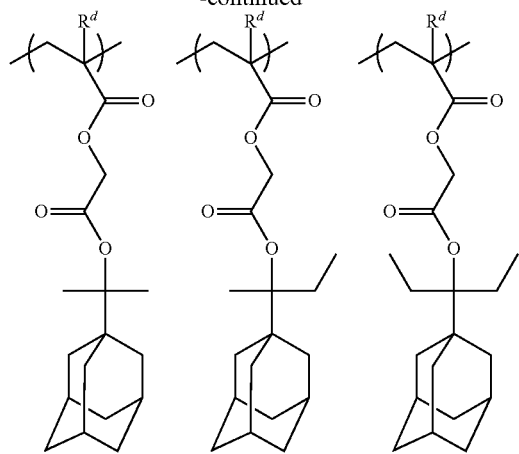
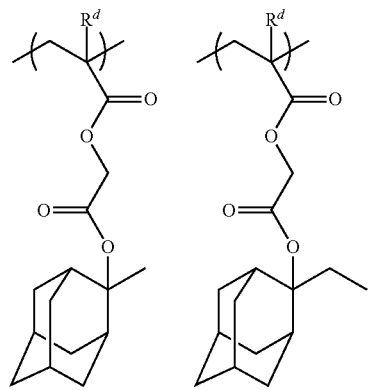
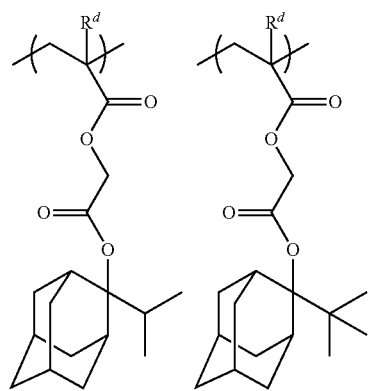
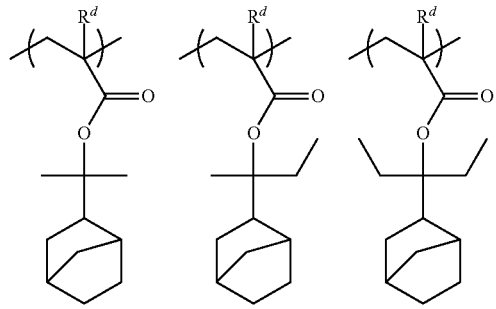
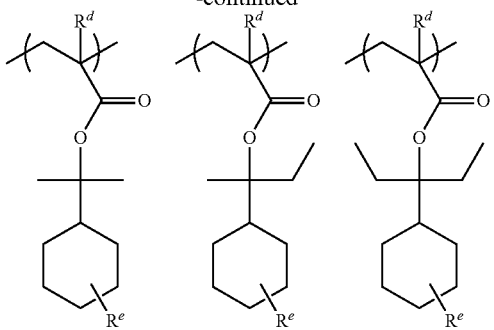
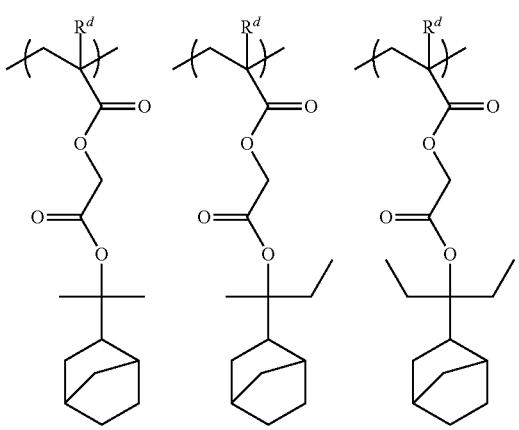
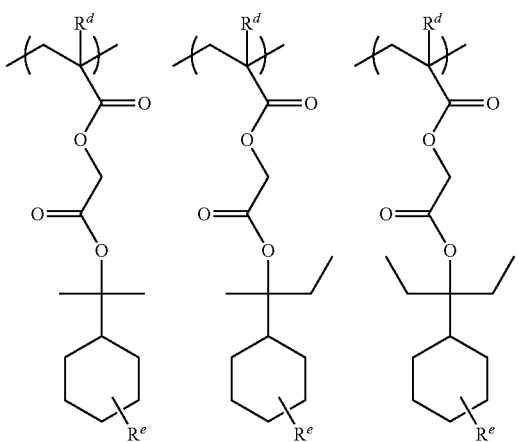
[Chem. 8]
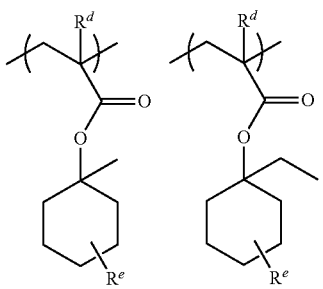

-continued

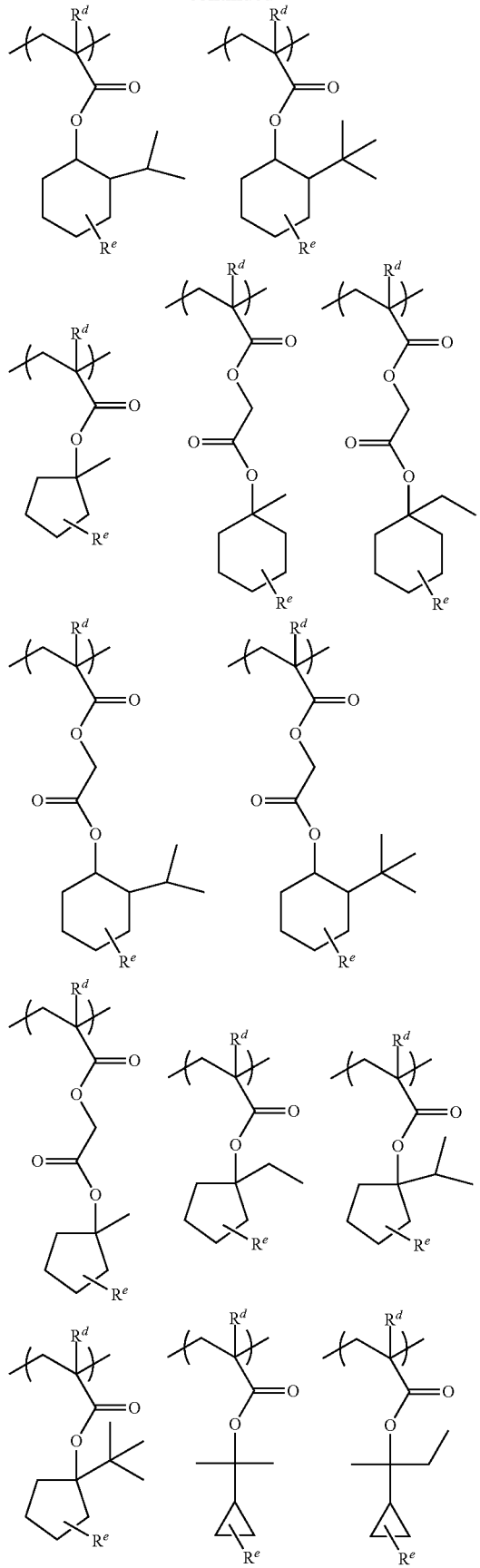
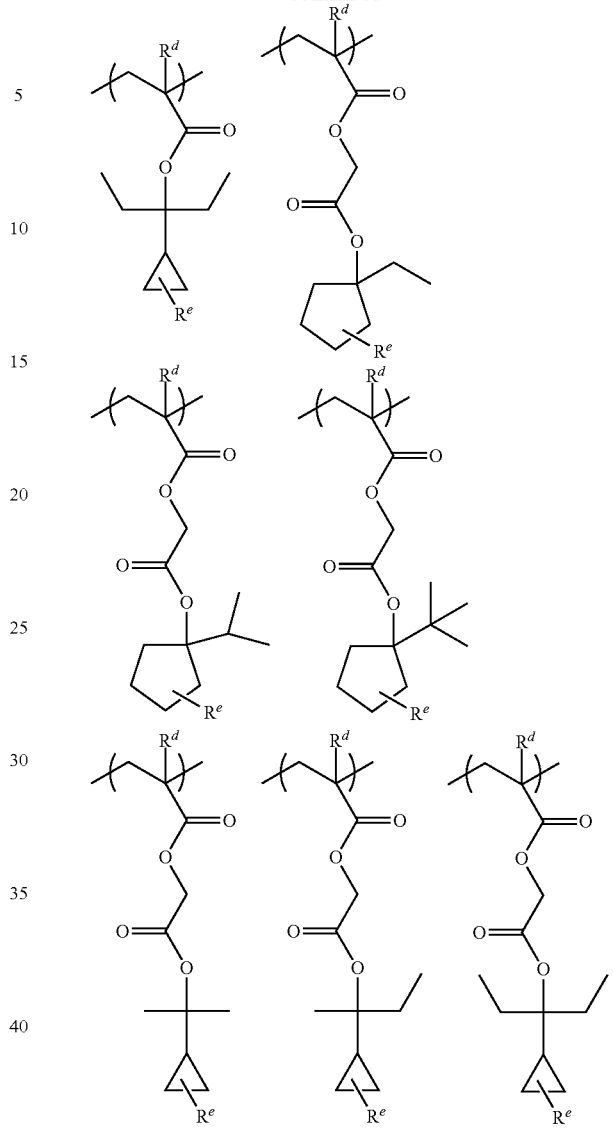

As the polymerization unit represented by Formula (1) above, in addition to the polymerization unit represented by the monomer unit a, polymerization units (excluding, however, polymerization units corresponding to a monomer unit b described below) that correspond to an unsaturated carboxylate containing a lactone ring, in which an oxygen atom constituting an ester bond is bonded to the β-position of the lactone ring, and at least one hydrogen atom is provided at the α-position of the lactone ring can also be used.

One type of the polymerization unit represented by Formula (1) may be used alone, or a combination of two or more types may be used. The polymerization units represented by Formula (1) above preferably include at least one polymerization unit selected from the group consisting of polymerization units represented by Formulas (a1) to (a4). In addition, as the polymerization units represented by Formula (1) above, a combination of at least one polymerization unit selected from the group consisting of polymerization units represented by Formulas (a1) to (a4), and a polymerization unit represented by Formula (1) (other polymerization unit represented by Formula (1)) other than the at least one polymerization unit selected from the group consisting of polymerization units represented by Formulas (a1) to (a4) above may be used The other polymerization unit represented by Formula (1) is preferably a polymerization unit represented by Formula (1) in which $R^1$ is a group having a tertiary hydrocarbon group (for example, a t-butyl group, and a t-amyl group).

Furthermore, the resin of an embodiment of the present invention preferably contains an alicyclic skeleton having at least [—C(=O)—O—], [-S(=O)$_2$—O—], or [—C(=O)—O—C(=O)—]. Containing the alicyclic skeleton can impart a strong adhesion to the substrate and etching resistance to the resin. The resin of an embodiment of the present invention preferably contains the alicyclic skeleton, as a polymerization unit having the alicyclic skeleton. Note that a polymerization unit containing an alicyclic skeleton having at least [—C(=O)—O—], [—S(=O)$_2$—O—], or [—C(=O)—O—C(=O)—] described above may be referred to as a "monomer unit b".

The monomer unit b contains, among others, preferably at least one polymerization unit selected from the group consisting of polymerization units represented by Formulas (b1) to (b5) below. In Formulas (b1) to (b5) below, R represents a hydrogen atom, a halogen atom, or an alkyl group that has from 1 to 6 carbon atoms and may have a halogen atom, and A represents a single bond or a linking group. X represents no bond, a methylene group, an ethylene group, an oxygen atom, or a sulfur atom. Y represents a methylene group or a carbonyl group. Z represents a divalent organic group (e.g., such as an alkylene group exemplified and described as an alkylene group that may be contained in the A in the polymerization units represented by Formulas (a1) to (a4) (in particular, a linear alkylene group having from 1 to 3 carbon atoms)). $V^1$ to $V^3$ are the same or different and represent —CH$_2$—, [—C(=O)—], or [—C(=O)—O—] with the proviso that at least one of $V^1$ to $V^3$ is [—C(=O)—O—]. $R^8$ to $R^{14}$ are the same or different and represent a hydrogen atom, a fluorine atom, an alkyl group that may have a fluorine atom, a hydroxy group that may be protected with a protecting group, a hydroxyalkyl group that may be protected with a protecting group, a carboxy group that may be protected with a protecting group, or a cyano group.

[Chem. 9]

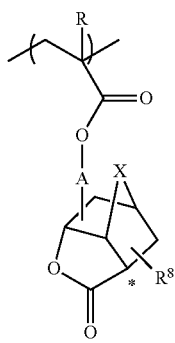

(b1)

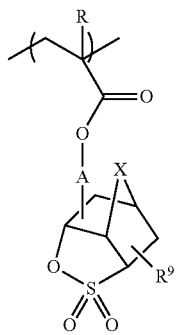

(b2)

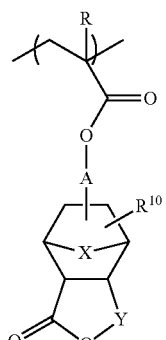

(b3)

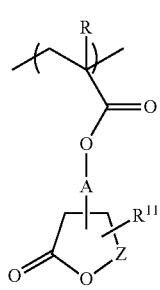

(b4)

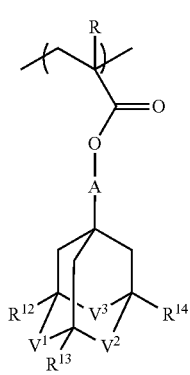

(b5)

Examples of the R and A in the polymerization units represented by Formulas (b1) to (b5) include examples similar to those for the R and A in the polymerization units represented by Formulas (a1) to (a4). With respect to the $R^8$ to $R^{14}$ in the polymerization units represented by Formulas (b1) to (b5), examples of the alkyl group, hydroxy group that may be protected by a protecting group, hydroxyalkyl group that may be protected by a protecting group, and carboxy group that may be protected by a protecting group include the same examples as those given with respect to $R^a$ in the polymerization units represented by Formulas (a1) to (a4).

Examples of the alkyl group having a fluorine atom in the $R^8$ to $R^{14}$ include groups (fluoro ($C_{1-6}$) alkyl groups) in which one or more of the hydrogen atoms constituting the alkyl group are substituted with fluorine atoms, such as a trifluoromethyl group, and a 2,2,2-trifluoroethyl group.

In the polymerization units represented by Formulas (b1) to (b4) above, the number of moieties of each of the $R^8$ to $R^{11}$ is preferably one or more, and preferably from 1 to 3. In addition, when the polymerization units represented by Formulas (b1) to (b4) above includes two or more of the $R^8$ to $R^{11}$, each of the two or more $R^8$ to $R^{11}$ may be the same or different.

Among the monomer units b, a polymerization unit represented by Formula (b1) with $R^8$ being an electron-withdrawing group such as a cyano group, a group having an amide group, a group having an imide group, or a fluoro ($C_{1-6}$) alkyl group; a polymerization unit represented by Formula (b2); a polymerization unit represented by Formula (b3) with Y being a carbonyl group; a polymerization unit represented by Formula (b4); and a polymerization unit represented by Formula (b5) are preferable from the viewpoints of being able to impart excellent substrate adhesion and etching resistance to the resin, to provide excellent solubility in an alkaline developing solution, and to form fine patterns with high precision.

In Formula (b1) above, when $R^8$ is an electron-withdrawing group such as a cyano group, a group having an amide group, a group having an imide group, or a fluoro ($C_{1-6}$) alkyl group, the $R^8$ is particularly preferably bonded at least to the carbon atom designated by * in Formula (b1).

Specific examples of the monomer unit b include polymerization units represented by the following formulas. In the monomer units represented by the following formulas, $R^d$ represents a methyl group or a hydrogen atom. The monomer unit b can be introduced into the resin by polymerizing the corresponding unsaturated carboxylate.

[Chem. 10]

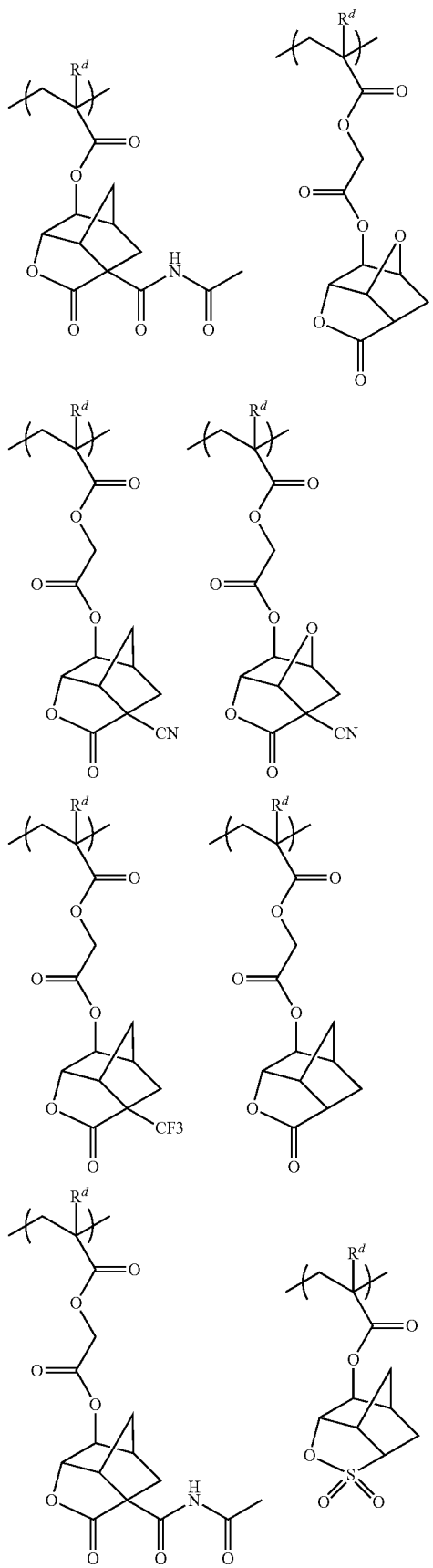
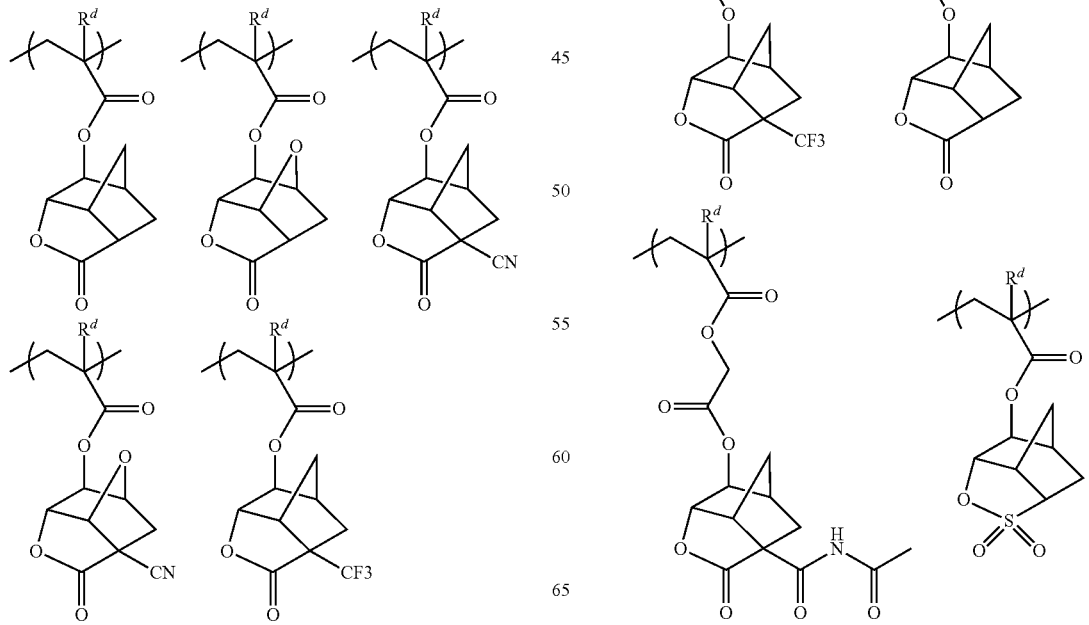

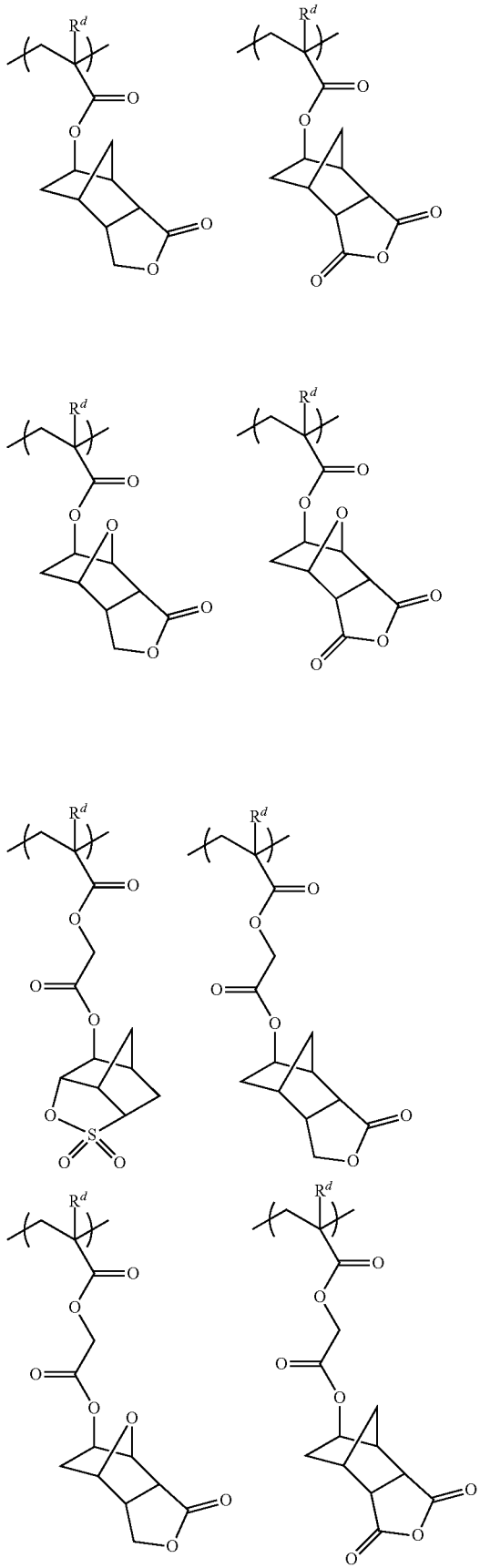

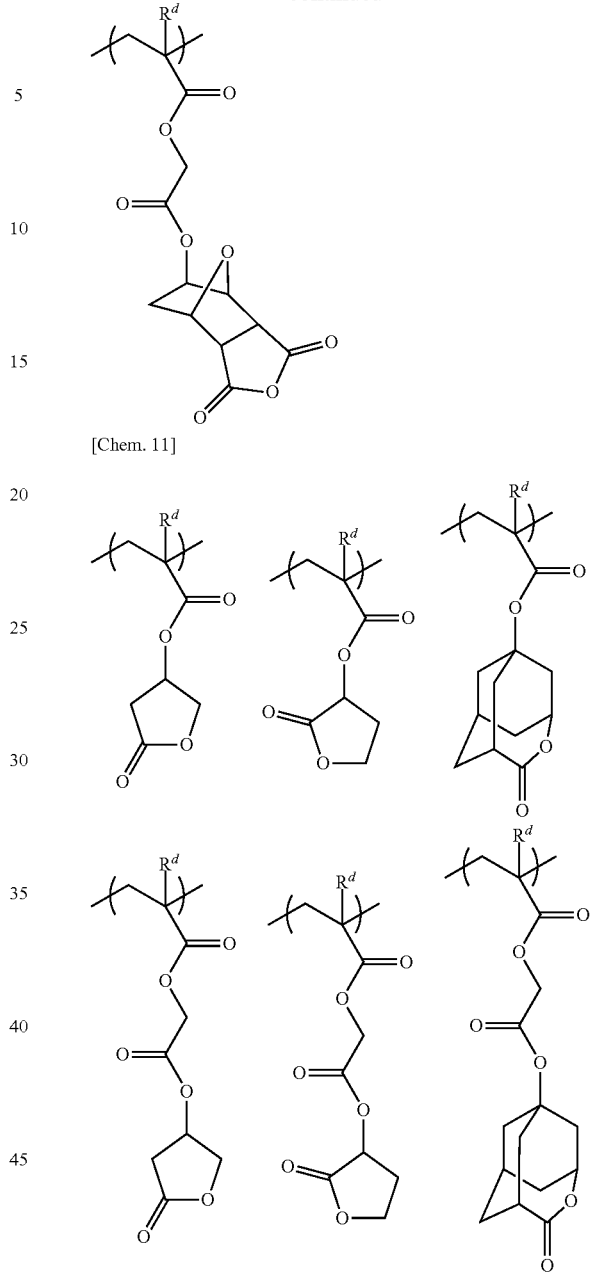

The resin of an embodiment of the present invention may further have a monomer unit c. The monomer unit c is a polymerization unit represented by Formula (c1) below. When the resin of an embodiment of the present invention contains the monomer unit c as a polymerization unit, high transparency and etching resistance can be imparted to the photoresist resin. In the formula, R represents a hydrogen atom, a halogen atom, or an alkyl group that has from 1 to 6 carbon atoms and may have a halogen atom. A represents a single bond or a linking group. $R^b$ represents a hydroxy group that may be protected with a protecting group, a hydroxyalkyl group that may be protected with a protecting group, a carboxy group that may be protected with a protecting group, or a cyano group, and among them, a hydroxy group and a cyano group are preferred. q represents an integer of 1 to 5. A ring $Z^2$ represents an alicyclic hydrocarbon ring having from 6 to 20 carbon atoms. When q represents an integer from 2 to 5, from 2 to 5 $R^b$s may each be the same or different.

[Chem. 12]

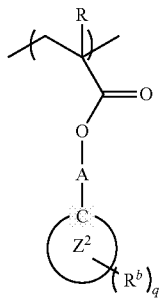

(c1)

Examples of the R and A in the polymerization unit represented by Formula (c1) include examples similar to those for the R and A in the polymerization units represented by Formulas (a1) to (a4). With respect to the $R^b$ in the polymerization units represented by Formula (c1), examples of the hydroxy group that may be protected by a protecting group, the hydroxyalkyl group that may be protected by a protecting group, and the carboxy group that may be protected by a protecting group include the same examples as those given for $R^a$ in the polymerization units represented by Formulas (a1) to (a4).

The ring $Z^2$ in the polymerization unit represented by Formula (c1) represents an alicyclic hydrocarbon ring having from 6 to 20 carbon atoms, and examples include monocyclic alicyclic hydrocarbon rings, such as approximately 6- to 20-membered (preferably 6- to 15-membered and particularly preferably 6- to 12-membered) cycloalkane rings, such as a cyclohexane ring and a cyclooctane ring; and approximately 6- to 20-membered (preferably 6- to 15-membered and particularly preferably 6- to 10-membered) cycloalkene rings, such as a cyclohexene ring; an adamantane ring; rings containing a norbornane ring or a norbornene ring, such as a norbornane ring, a norbornene ring, a bornane ring, an isobornane ring, a tricyclo[5.2.1.0$^{2,6}$]decane ring, and a tetracyclo[4.4.0.1$^{2,5}$.1$^{7,10}$]dodecane ring; a ring in which a polycyclic aromatic fused ring is hydrogenated (preferably a fully hydrogenated ring), such as a perhydroindene ring, a decalin ring (perhydronaphthalene ring), a perhydrofluorene ring (tricyclo[7.4.0.0$^{3,8}$]tridecane ring), and a perhydroanthracene ring; approximately from bicyclic to hexacyclic bridged hydrocarbon rings, such as bridged hydrocarbon rings of a bicyclic system, tricyclic system, tetracyclic system, etc. (e.g., bridged hydrocarbon rings having approximately from 6 to 20 carbon atoms), such as a tricyclo[4.2.2.1$^{2,5}$]undecane ring. Among them, the ring $Z^2$ is preferably a ring containing a norbornane ring or a norbornene ring; and an adamantane ring.

Specific examples of the monomer unit c include polymerization units represented by the following formulas. In the polymerization unit represented by the following formulas, $R^d$ represents a methyl group or a hydrogen atom. The monomer unit c can be introduced into the resin by polymerizing the corresponding unsaturated carboxylate.

[Chem. 13]

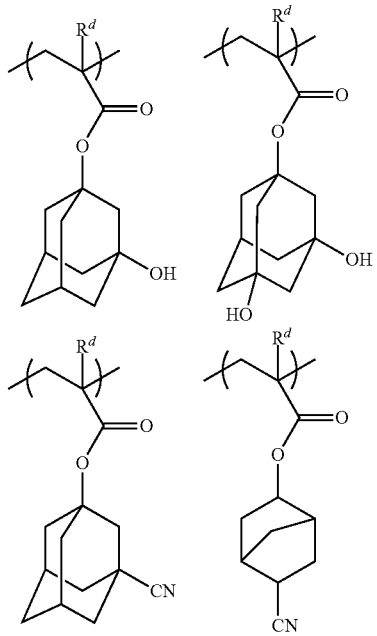

The resin of an embodiment of the present invention preferably contains at least one monomer unit selected from the group consisting of the monomer unit a, the monomer unit b, and the monomer unit c. In this case, the content of the monomer unit a in the resin of an embodiment of the present invention is, for example, from 1 to 99 mol %, and preferably from 5 to 95 mol %, based on the total amount of the monomer units constituting the resin. The content of the monomer unit b when the resin of an embodiment of the present invention contains the monomer unit b is, for example, from 1 to 99 mol %, preferably from 5 to 95 mol %, based on the total amount of the monomer units constituting the resin. The content of the monomer unit c when the resin of an embodiment of the present invention contains the monomer unit c is, for example, from 1 to 99 mol %, preferably from 5 to 95 mol %, based on the total amount of the monomer units constituting the resin.

The weight average molecular weight (Mw) of the resin of an embodiment of the present invention is not particularly limited, but, for example, is preferably from 1000 to 50000, and more preferably from 3000 to 20000. The molecular weight distribution (ratio of the weight average molecular weight to a number average molecular weight: Mw/Mn) of the resin of an embodiment of the present invention is not particularly limited as long as it is 3.5 or less, and is, for example, preferably from 1.1 to 3.0, and more preferably from 1.2 to 2.5. Note that in the present specification, the weight average molecular weight (Mw) and the number average molecular weight (Mn) can be measured, for example, through GPC using polystyrene as a standard material, and is preferably measured by the method used in the examples.

The acid value of the resin of an embodiment of the present invention is not particularly limited but is, for example, preferably 0.10 mmol/g or less, more preferably 0.05 mmol/g or less, and even more preferably 0.03 mmol/g or less. When the acid value is 0.10 mmol/g or less, the acid-degradable groups in the resin are protected without elimination, and therefore the resin of an embodiment of the present invention exhibits excellent resist performance, and favorable stability over time. Note that the lower limit of the acid value is not particularly limited but is, for example, 0 mmol/g.

Resin Production Method

The method of producing the resin of an embodiment of the present invention is not particularly limited, and examples thereof include a dropwise polymerization method. Examples of the dropwise polymerization method include a method including a step of adding dropwise the monomer or a solution containing the monomer in the presence of a polymerization initiator to polymerize the monomer (this step may be hereinafter referred to as "polymerization step"). More specific examples include a method including [1] a step of adding dropwise a solution containing a polymerization initiator and a monomer, [2] a step of adding dropwise the monomer or the solution containing the monomer into a solution containing the polymerization initiator, and other steps. The dropwise polymerization method may be performed in the presence of a chain transfer agent in addition to a polymerization initiator. Examples of monomers include monomers corresponding to the monomer unit a, the monomer unit b, and the monomer unit c.

In the method of producing the resin of an embodiment of the present invention, the inclusion of a step of adding a polymerization inhibitor to a reaction solution after the polymerization step (this step may be hereinafter referred to as "polymerization suppression step") is preferable from the perspective of obtaining a resin having high solubility in a resist solvent.

A known radical polymerization initiator can be used as the polymerization initiator, and examples thereof include azo-based compounds, peroxide-based compounds, and redox-based compounds, and in particular, preferred examples include dimethyl-2,2'-azobisisobutyrate, azobisisobutyronitrile, 2,2'-azobis(2-methylbutyronitrile), t-butyl peroxypivalate, di-t-butyl peroxide, isobutyryl peroxide, lauroyl peroxide, succinic peroxide, dicinnamyl peroxide, di-n-propyl peroxydicarbonate, t-butyl peroxyallyl monocarbonate, benzoyl peroxide, hydrogen peroxide, and ammonium persulfate.

The amount of the polymerization initiator to be used is not particularly limited as long as it is an amount necessary to obtain a resin having a desired molecular weight distribution. The amount is, for example, from 0.01 to 30 parts by weight, preferably from 0.2 to 20 parts by weight, and more preferably from 0.5 to 10 parts by weight based on the total amount of the monomers (100 parts by weight).

A known chain transfer agent used in radical polymerization can be used as the chain transfer agent, and examples include thiols such as n-dodecyl mercaptan, n-octyl mercaptan, n-butyl mercaptan, tert-butyl mercaptan, n-lauryl mercaptan, mercaptoethanol, mercaptopropanol, and triethylene glycol dimercaptan; thiol acids and esters thereof such as mercaptopropionic acid, thiobenzoic acid, thioglycolic acid, and thiomalic acid, and alkyl esters thereof; alcohols such as isopropyl alcohol, amines such as dibutylamine, hypophosphites such as sodium hypophosphite, α-methylstyrene dimer, terpinolene, myrcene, limonene, α-pinene, and β-pinene.

The amount of the chain transfer agent to be used is not particularly limited, but is preferably from 0.001 to 100 mol, more preferably from 0.01 to 50 mol, even more preferably from 0.1 to 30 mol, and particularly preferably from 1 to 10 mol, based on the total amount of the monomers (100 mol).

In addition, the amount of the chain transfer agent to be used based on the total amount of the monomers (100 parts by weight) is not particularly limited, but is preferably from 0.1 to 100 parts by weight, more preferably from 0.5 to 50 parts by weight, and even more preferably from 1 to 25 parts by weight.

The polymerization step may be performed without a solvent or may be performed in the presence of a polymerization solvent. Examples of the polymerization solvent include glycol-based solvents (the glycol-based compounds), ester-based solvents, ketone-based solvents, ether-based solvents, amide-based solvents, sulfoxide-based solvents, monohydric alcohol-based solvents (the monohydric alcohol-based compounds), hydrocarbon-based solvents, and mixed solvents thereof. Examples of the glycol solvent include, besides the glycol-based compounds, propylene glycol monomethyl ether acetate, ethylene glycol monomethyl ether acetate, ethylene glycol monoethyl ether acetate, and ethylene glycol monobutyl ether acetate. Examples of the ester-based solvent include lactate ester-based solvents, such as ethyl lactate; propionate ester-based solvents, such as methyl 3-methoxypropionate; acetate ester-based solvents, such as methyl acetate, ethyl acetate, propyl acetate, and butyl acetate. Examples of the ketone-based solvent include acetone, methyl ethyl ketone, methyl isobutyl ketone, methyl amyl ketone, cyclopentanone, and cyclohexanone. Examples of the ether-based solvent include linear ethers, such as diethyl ether, diisopropyl ether, dibutyl ether, and dimethoxyethane; and cyclic ethers, such as tetrahydrofuran and dioxane. Examples of the amide-based solvent include N,N-dimethylformamide. Examples of the sulfoxide-based solvent include dimethyl sulfoxide. Examples of the hydrocarbon-based solvent include aliphatic hydrocarbons, such as pentane, hexane, heptane, and octane; alicyclic hydrocarbons, such as cyclohexane and methylcyclohexane; and aromatic hydrocarbons, such as benzene, toluene, and xylene.

Preferred polymerization solvent include glycol-based solvents, such as propylene glycol monomethyl ether and propylene glycol monomethyl ether acetate; ester-based solvents, such as ethyl lactate; ketone-based solvents, such as acetone, methyl ethyl ketone, methyl isobutyl ketone, methyl amyl ketone, cyclopentanone, and cyclohexanone; and their mixed solvents.

The dropwise addition of the solution containing a monomer may be continuous dropwise addition (an aspect of adding dropwise over a certain period of time) or may be intermittent dropwise addition (an aspect of adding dropwise dividedly in multiple times). Furthermore, the rate and the like of dropwise addition may be changed one or more times during dropwise addition.

The total dropwise addition time of the solution containing a monomer (the time from the start of dropwise addition to the completion of dropwise addition) varies depending on the polymerization temperature, the type of monomer and the like, but is generally from 1 to 10 hours, preferably from 2 to 9 hours, and even more preferably from 3 to 8 hours.

The polymerization temperature is not particularly limited, but is, for example, preferably from 30 to 150° C., more preferably from 50 to 120° C., and even more preferably from 60 to 100° C. Note that during polymerization, the polymerization temperature may be changed one or more times within the range of polymerization temperatures described above.

In the polymerization step, a time for aging may be provided after the completion of the dropwise addition. The aging time is not particularly limited, but is, for example, preferably from 0.5 to 10 hours, and more preferably from 1 to 5 hours.

In an embodiment of the present invention, the inclusion of the polymerization suppression step is preferable from the perspective of obtaining a resin having high solubility in a resist solvent. That is, in an embodiment of the present invention, it is preferable to include the step of adding a specific amount of a polymerization inhibitor to the reaction solution obtained by the polymerization step, to suppress polymerization of the resin contained in the reaction solution and an unreacted monomer over time, thereby reducing production of a poorly soluble resin.

In the polymerization suppression step, the polymerization inhibitor may be added without cooling the reaction solution obtained by the polymerization step, or the polymerization inhibitor may be added after cooling. The cooling here means, for example, lowering the temperature of the reaction solution to room temperature (23° C.) or lower. Examples of cooling methods include air cooling and water cooling.

The polymerization inhibitor is not particularly limited, and examples thereof include hydroquinones such as hydroquinone, methylhydroquinone, t-butylhydroquinone, and 2,5-di-t-butylhydroquinone; phenols such as 2,6-di-t-butyl-4-methylphenol, 2,6-di-t-butylphenol, 2-t-butyl-4,6-dimethylphenol, and 4-methoxyphenol (methoquinone); benzoquinones such as p-benzoquinone, chloro-p-benzoquinone, 2,3-dimethyl-p-benzoquinone, 2,5-dimethyl-p-benzoquinone, 2,5-dichloro-p-benzoquinone, 2,6-dichloro-p-benzoquinone, methoxy-p-benzoquinone, methyl-p-benzoquinone, tetrabromo-p-benzoquinone, and tetrachloro-p-benzoquinone; N-oxyl compounds such as 4-amino-2,2,6,6-tetramethylpiperidine 1-oxyl, 4-acetamido-2,2,6,6-tetramethylpiperidine 1-oxyl, 4-carboxy-2,2,6,6-tetramethylpiperidine 1-oxyl, 4-cyano-2,2,6,6-tetramethylpiperidine 1-oxyl, 4-hydroxy-2,2,6,6-tetramethylpiperidine 1-oxyl, 4-hydroxy-2,2,6,6-tetramethylpiperidine 1-oxybenzoic acid, 2-hydroxy-2-azadamantane, 4-isothiocyanate-2,2,6,6-tetramethylpiperidine, 4-(2-iodoacetamido)-2,2,6,6-tetramethylpiperidine 1-oxyl, 4-[2-[2-(4-iodophenoxy)ethoxy]carbonyl]benzoyloxy -2,2,6,6-tetramethylpiperidine-1-oxyl, 4-methoxy-2,2,6,6-tetramethylpiperidine 1-oxyl, 4-methacryloyloxy-2,2,6,6-tetramethylpiperidine 1-oxyl, 4-oxo-2,2,6,6-tetramethylpiperidine 1-oxyl, and 2,2,6,6-tetramethyl-4-(2-propynyloxy)piperidine 1-oxyl; catechols such as 4-t-butyl catechol; nitro compounds such as o-dinitrobenzene, m-dinitrobenzene, p-dinitrobenzene, 2,4-dinitrotoluene, 1,3,5-trinitrobenzene, 1,3,5-trinitroanisole, and 1,3,5-trinitrotoluene; nitroso compounds such as ammonium nitrosophenylhydroxylamine and aluminum nitrosophenylhydroxylamine; amines such as diethylhydroxylamine and diphenylamine; phenothiazine; 1,1-diphenyl-2-picrylhydrazyl; and inorganic polymerization inhibitors such as copper chloride, copper sulfate, and iron sulfate. Among these polymerization inhibitors, hydroquinones and phenols are generally contained as a polymerization suppressing component in a raw material for resist application, that is, a monomer for preparing a resin for resist. Therefore, it is considered that the influence on lithography performance is low, which is preferable. One of these can be used alone or two or more in combination.

The amount of the polymerization inhibitor to be used is not particularly limited, but is, for example, preferably 10 ppm or greater, more preferably from 50 to 2000 ppm, even more preferably from 100 to 1000 ppm, and most preferably from 200 to 500 ppm, based on a resin solid content contained in the reaction solution after the polymerization step.

The resin produced in the polymerization step or the resin obtained through the polymerization suppression step can be collected by precipitation (including re-precipitation), for example. For example, the target resin can be obtained by adding a polymerization solution (polymer dope) into a solvent (precipitation solvent) to precipitate the resin; or dissolving the resin once again in an appropriate solvent, and adding the solution into a solvent (re-precipitation solvent) to re-precipitate the resin; or alternatively adding a solvent (a re-precipitation solvent or a polymerization solvent) into a polymerization solution (polymer dope) to dilute the polymerization solution. The precipitation or re-precipitation solvent may be either an organic solvent or water, and may be a mixed solvent.

The precipitation or re-precipitation solvent is not particularly limited, and known or customarily used solvents can be used. The precipitation or re-precipitation solvent may be the same solvent as the polymerization solvent described above, or may be a different solvent. Examples of the precipitation or re-precipitation solvent include organic solvents exemplified as the polymerization solvent, namely, glycol-based solvents, ester-based solvents, ketone-based solvents, ether-based solvents, amide-based solvents, sulfoxide-based solvents, monohydric alcohol-based solvents, and hydrocarbon-based solvents; halogenated hydrocarbons including, halogenated aliphatic hydrocarbons such as methylene chloride, chloroform, and carbon tetrachloride; and halogenated aromatic hydrocarbons such as chlorobenzene, and dichlorobenzene; nitro compounds such as nitromethane and nitroethane; nitriles such as acetonitrile and benzonitrile; carbonates such as dimethyl carbonate, diethyl carbonate, ethylene carbonate, and propylene carbonate; carboxylic acids such as acetic acid; and mixed solvents containing these solvents.

Among these, the precipitation or re-precipitation solvent is preferably a solvent containing at least a hydrocarbon (particularly an aliphatic hydrocarbon such as hexane or heptane) or an alcohol (such as, in particular, methanol, ethanol, propanol, isopropyl alcohol, or butanol). In such a solvent containing at least a hydrocarbon, the ratio of a hydrocarbon (e.g., aliphatic hydrocarbons such as hexane and heptane) to other solvents (e.g., esters such as ethyl acetate) is, for example, the hydrocarbon/other solvents (volume ratio; 25° C.)=10/90 to 99/1, preferably the hydrocarbon/other solvents (volume ratio; 25° C.)=30/70 to 98/2, and more preferably the hydrocarbon/other solvents (volume ratio; 25° C.)=50/50 to 97/3.

The precipitation or re-precipitation solvent is also preferably a mixed solvent of an alcohol (particularly methanol) and water, or a mixed solvent of a glycol-based solvent (particularly polyethylene glycol) and water. In this case, the ratio (volume ratio; 25° C.) of the organic solvent (alcohol or glycol-based solvent) to water is, for example, the organic solvent/water (volume ratio; 25° C.)=10/90 to 99/1, preferably the organic solvent/water (volume ratio; 25° C.)=30/70 to 98/2, and more preferably the organic solvent/water (volume ratio; 25° C.)=50/50 to 97/3.

The resin obtained by precipitation (including re-precipitation) is subjected as necessary to rinsing or a treatment of loosening and dispersing the resin in a solvent under stirring to wash the resin (which may be referred to as "repulping"). The resin may be subjected to rinsing after repulping. Repulping or rinsing the resin produced by the polymerization with a solvent can efficiently remove a residual monomer, a low molecular weight oligomer, or the like adhered to the resin.

In the production method of an embodiment of the present invention, among the solvents, a solvent containing at least a hydrocarbon (particularly an aliphatic hydrocarbon such as hexane or heptane), an alcohol (particularly methanol, ethanol, propanol, isopropyl alcohol, and butanol, etc.), or esters (particularly, ethyl acetate, etc.) are preferable as the re-pulping and rinsing treatment solvents.

After the precipitation (including re-precipitation), re-pulping treatment, or rinsing, the solvent may be removed by, for example, decantation, filtration, or the like as necessary, and a drying treatment may be performed.

Resin Composition

The resin composition of an embodiment of the present invention contains at least the resin of an embodiment of the present invention and a radiation-sensitive acid generating agent.

A customarily used or known compound that efficiently generates acid by exposure to radiation such as visible light, ultraviolet light, far ultraviolet light, electron beams, and X-rays can be used as the radiation-sensitive acid generating agent, and is a compound formed from a base nucleus and an acid that is generated. Examples of the nucleus include onium salt compounds, such as iodonium salts, sulfonium salts (including tetrahydrothiophenium salts), phosphonium salts, diazonium salts, and pyridinium salts; sulfonimide compounds; sulfone compounds; sulfonate compounds; disulfonyldiazomethane compounds; disulfonylmethane compounds; oxime sulfonate compounds; and hydrazine sulfonate compounds. In addition, examples of the acid to be generated by the exposure include alkyl or fluorinated alkyl sulfonic acids, alkyl or fluorinated alkyl carboxylic acids, and alkyl or fluorinated alkyl sulfonyl imide acids. Only one of them may be used, or two or more may be used.

The amount of the radiation-sensitive acid generating agent to be used can be selected, as appropriate, in accordance with, the strength of the acid generated by irradiation with radiation, the ratio of each repeating unit in the resin, and the like. For example, the amount to be used can be selected from a range from 0.1 to 30 parts by weight, preferably from 1 to 25 parts by weight, and even more preferably from 2 to 20 parts by weight based on 100 parts by weight of the resin.

The resin composition can be prepared, for example, by mixing the resin and the radiation-sensitive acid generating agent in a solvent for a resist. Solvents such as a glycol-based solvent, an ester-based solvent, a ketone-based solvent, and a mixed solvent thereof exemplified as the polymerization solvent can be used as the solvent for a resist.

The resin concentration of the resin composition is, for example, from 3 to 40 wt %. The resin composition may contain alkali-soluble component such as an alkali soluble resin (for example, a novolac resin, a phenolic resin, an imide resin, and a carboxy group-containing resin), a coloring agent (for example, a dye), and the like.

Pattern Formation Method

The resin composition of an embodiment of the present invention is applied to a base material or substrate, dried, and then the coating film (resist film) is exposed via a prescribed mask (or further subjected to post-exposure baking) to form a latent image pattern, and then subjected to alkali dissolving to thereby achieve excellent swelling resistance and form a fine pattern with high precision.

Examples of the base material or substrate include silicon wafers, metals, plastics, glass, and ceramics. The resin composition can be applied using a known application means such as a spin coater, a dip coater, and a roller coater. The thickness of the coating film is, for example, preferably from 0.05 to 20 μm, and more preferably from 0.1 to 2 μm.

For the exposure, radiation, such as visible light, ultraviolet light, far ultraviolet light, electron beams, or X-rays can be used.

An acid is generated from the radiation-sensitive acid generating agent by exposure, and the acid readily promotes elimination of a protecting group (acid-degradable group), such as a carboxy group of a polymerization unit of the resin composition (repeating unit having an acid-degradable group) that becomes alkaline soluble by the action of an acid, and thereby a carboxy group or the like that contributes to solubilization is produced. As a result, the predetermined pattern can be formed with good precision by development with an alkaline developer.

EXAMPLES

Hereinafter, the present invention will be described in more detail based on examples, but the present invention is not limited by these examples. The weight average molecular weight (Mw) and the number average molecular weight (Mn) of the resin were determined by gel permeation chromatography (GPC) measurement using a tetrahydrofuran solvent. Polystyrene was used for a standard sample, and a refractometer (refractive index detector; RI detector) was used as a detector. In addition, the GPC measurement was performed using three columns connected in series, available from Showa Denko K.K. ("KF-806L (trade name)"), under conditions of a column temperature of 40° C., an RI temperature of 40° C., and a tetrahydrofuran flow rate of 0.8 mL/min. The molecular weight distribution (Mw/Mn) was calculated from the measurements.

Example 1 (Preparation of Resin A-1)

34.0 g of propylene glycol monomethyl ether acetate was introduced into a round bottom flask equipped with a reflux tube, a stirrer, and a 3-way cock under a nitrogen atmosphere, and the temperature was maintained at 80° C. While stirring, a mixture solution of 10.57 g (0.0476 mol) of 5-oxo-4-oxatricyclo[4.2.1.0$^{3,7}$]nonan-2-yl methacrylate, 2.31 g (0.0098 mol) of 3-hydroxyadamantane-1-yl methacrylate, 3.37 g (0.0122 mol) of 1-(adamantane-1-yl)-1-methylpropyl methacrylate, 13.75 g (0.0525 mol) of 2-isopropyladamantane-2-yl methacrylate, 0.75 g of dimethyl-2, 2'-azobisisobutyrate [trade name "V-601" available from Wako Pure Chemical Industries, Ltd.], and 136.0 g of propylene glycol monomethyl ether acetate, was added dropwise thereto at a constant rate over a period of 6 hours. After completion of the dropwise addition, the reaction solution was continued to stir for another 2 hours. After the completion of stirring, 9 mg of methoquinone was added, the reaction solution was then cooled to an internal temperature of 23° C. over a period of 4 hours. Immediately thereafter, the reaction solution was added dropwise under stirring into a mixed liquid (25° C.) of heptane and ethyl acetate 9:1 (weight ratio), the amount of the mixed liquid being ten times the amount of the reaction solution. The resulting precipitate was filtered off and dried under reduced pressure, and 23.2 g of the desired resin A-1 was obtained. The collected resin as analyzed by GPC had an Mw (weight average molecular weight) of 10100 and a molecular weight distribution (Mw/Mn) of 1.8.

The resin A-1 has polymerization units represented by the following formulas.

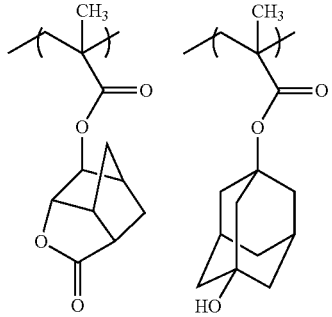

[Chem. 14]

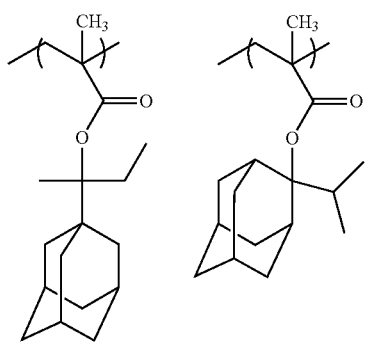

Example 2 (Preparation of Resin A-2)

34.0 g of cyclohexanone was introduced into a round bottom flask equipped with a reflux tube, a stirrer, and a 3-way cock under a nitrogen atmosphere, and the temperature was maintained at 80° C. While stirring, a mixture solution of 11.06 g (0.0448 mol) of 6-cyano-5-oxo-4-oxatricyclo[4.2.1.0$^{3,7}$]nonan-2-yl methacrylate, 15.86 g (0.0605 mol) of 2-isopropyladamantane-2-yl methacrylate, 3.08 g (0.0157 mol) of 1-isopropylcyclopentane-1-yl methacrylate, 0.57 g of dimethyl-2,2'-azobisisobutyrate [trade name "V-601" available from Wako Pure Chemical Industries, Ltd.], and 136.0 g of cyclohexanone, was added dropwise thereto at a constant rate over a period of 6 hours. After completion of the dropwise addition, the reaction solution was continued to stir for another 2 hours. After the completion of stirring, the reaction solution was cooled to an internal temperature of 23° C. over a period of 10 minutes. Immediately thereafter, 21 mg of hydroquinone was added and stored at 23° C. for one day until purification operation. After storage, the reaction solution was added dropwise under stirring into a mixed liquid (25° C.) of heptane and ethyl acetate 9:1 (weight ratio), the amount of the mixed liquid being ten times the amount of the reaction solution. The resulting precipitate was filtered off and dried under reduced pressure, and 19.5 g of the desired resin A-2 was obtained. The collected resin as analyzed by GPC had an Mw (weight average molecular weight) of 10200 and a molecular weight distribution (Mw/Mn) of 1.8.

The resin A-2 has polymerization units represented by the following formulas.

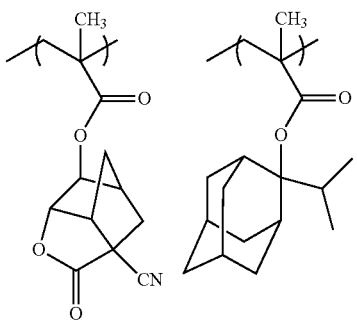

[Chem. 15]

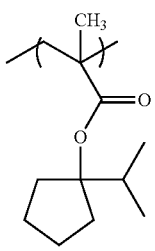

Example 3 (Preparation of Resin A-3)

34.0 g of propylene glycol monomethyl ether acetate was introduced into a round bottom flask equipped with a reflux tube, a stirrer, and a 3-way cock under a nitrogen atmosphere, and the temperature was maintained at 80° C. While stirring, a mixture solution of 8.76 g (0.0395 mol) of 5-oxo-4-oxatricyclo[4.2.1.0$^{3,7}$]nonan-2-yl methacrylate, 4.40 g (0.0259 mol) of 2-oxotetrahydrofuran-3-yl methacrylate, 8.26 g (0.0299 mol) of 1-(adamantane-1-yl)-1-methylpropyl methacrylate, 8.58 g (0.0408 mol) of 1-(cyclohexane-1-yl)-1-methylethyl methacrylate, 0.90 g of dimethyl-2,2'-azobisisobutyrate [trade name "V-601" available from Wako Pure Chemical Industries, Ltd.], and 136.0 g of propylene glycol monomethyl ether acetate, was added dropwise thereto at a constant rate over a period of 6 hours. After completion of the dropwise addition, the reaction solution was continued to stir for another 2 hours. After the completion of stirring, 6 mg of 4-acetamido-2,2,6,6-tetramethylpiperidine 1-oxyl free radical was added, and the reaction solution was cooled to an internal temperature of 23° C. over a period of 4 hours, and then stored at 23° C. for one day until the purification operation. After storage, the reaction solution was added dropwise under stirring into a mixed liquid (25° C.) of heptane and ethyl acetate 9:1 (weight ratio), the amount of the mixed liquid being ten times the amount of the reaction solution. The resulting precipitate was filtered off and dried under reduced pressure, and 24.7 g of the desired resin A-3 was obtained. The collected resin as analyzed by GPC had an Mw (weight average molecular weight) of 14800 and a molecular weight distribution (Mw/Mn) of 2.0.

The resin A-3 has polymerization units represented by the following formulas.

[Chem. 16]

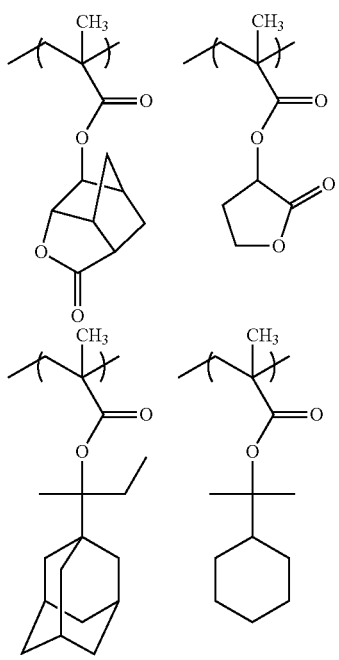

Comparative Example 1 (Preparation of Resin B-1)

23.4 g of the desired resin B-1 was obtained in the same manner as in Example 1 except that no methoquinone was added after the completion of stirring. The collected resin as analyzed by GPC had an Mw (weight average molecular weight) of 10200 and a molecular weight distribution (Mw/Mn) of 1.9.

Comparative Example 2 (Preparation of Resin B-2)

19.6 g of the desired resin B-2 was obtained in the same manner as in Example 2 except that no hydroquinone was added after cooling of the reaction solution. The collected resin as analyzed by GPC had an Mw (weight average molecular weight) of 10100 and a molecular weight distribution (Mw/Mn) of 1.8.

Comparative Example 3 (Preparation of Resin B-3)

24.6 g of the desired resin B-3 was obtained in the same manner as in Example 3 except that 4-acetamido-2,2,6,6-tetramethylpiperidine 1-oxyl free radical was not added after the completion of stirring. The collected resin as analyzed by GPC had an Mw (weight average molecular weight) of 15100 and a molecular weight distribution (Mw/Mn) of 2.0.

[Evaluation of Turbidity]

The resins A-1 to 3 and B-1 to 3 were dissolved in propylene glycol monomethyl ether acetate in such a way that the solid content concentration was 5 wt %, and respective resin solutions were prepared. The polystyrene equivalent turbidity of the resin solution was measured using a turbidity meter (model number: NDH-300A, available from Nippon Denshoku Industries Co., Ltd.) according to "Drinking Water Testing Methods" of Japan Water Works Association of 2003, Ministry of Health, Labor and Welfare Ordinance No. 261 of Japan. A specific procedure is as follows.

Turbidity measurement was performed on a turbidity standard solution (polystyrene) 100° II available from FUJI-FILM Wako Pure Chemical Corporation with an NDH-300A, and, as a result, the turbidity was 36.62. From this value, it can be seen that when a value measured with the NDH-300A is 1.00, the polystyrene equivalent turbidity is 2.731. In other words, the polystyrene equivalent turbidity "Y" can be derived by the following equation. In the equation, "X" is a measured value.

$Y = 2.731 X$

The polystyrene equivalent turbidity of the resin solution was determined according to the above formula.

TABLE 1

| Resin | Mw | Mw/Mn | Turbidity |
|---|---|---|---|
| A-1 | 10100 | 1.8 | <1 |
| A-2 | 10200 | 1.8 | <1 |
| A-3 | 14800 | 2.0 | <1 |
| B-1 | 10200 | 1.9 | 145 |
| B-2 | 10100 | 1.8 | 82 |
| B-3 | 15100 | 2.0 | 98 |

As can be seen from the evaluation results, it was clear that the resin (resins A-1 to 3) of an embodiment of the present invention had low polystyrene equivalent turbidity. On the other hand, it was clear that the resins B-1 to 3 had high polystyrene equivalent turbidity and were incompatible with photoresist applications. From this, it is conceived that the resin of an embodiment of the present invention can form a fine pattern with good precision.

To summarize the above, configurations and variations of the present invention are described below.

[1] A photoresist resin composed of an acrylic resin, wherein when the photoresist resin is dissolved in propylene glycol monomethyl ether acetate in such a way that a resin solid content concentration is 5 wt %, a polystyrene equivalent turbidity measured using a method described in "Drinking Water Testing Methods" of Japan Water Works Association of 2003, Ministry of Health, Labor and Welfare Ordinance No. 261 of Japan is 30 or less, 20 or less, 10 or less, 5 or less, or 3 or less.

[2] The photoresist resin according to [1], containing at least one polymerization unit selected from the group consisting of polymerization units represented by Formulas (a1) to (a4), where R represents a hydrogen atom, a halogen atom, or an alkyl group that has from 1 to 6 carbon atoms and may have a halogen atom; A represents a single bond or a linking group; $R^2$ to $R^4$ are the same or different and represent an alkyl group that has from 1 to 6 carbon atoms and may have a substituent; $R^2$ and $R^3$ may be bonded to each other to form a ring; $R^5$ and $R^6$ are the same or different and represent an alkyl group that has from 1 to 6 carbon atoms and may have a hydrogen atom or a substituent; $R^7$ represents a —COOR$^c$ group, and the R$^c$ represents a tertiary hydrocarbon group that may have a substituent, a tetrahydrofuranyl group, a tetrahydropyranyl group, or an oxepanyl group; n represents an integer of 1 to 3; $R^a$ represents a substituent bonded to a ring $Z^1$, and each $R^a$ is the same or different and represents an oxo group, an alkyl group, a hydroxy group that may be protected with a protecting group, a hydroxyalkyl group that may be protected with a protecting group, or a carboxy group that may be protected with a protecting group; p represents an integer of 0 to 3; and the ring $Z^1$ represents an alicyclic hydrocarbon ring having from 3 to 20 carbon atoms.

[3] The photoresist resin according to [2], wherein a content of at least one polymerization unit selected from the group consisting of the polymerization units represented by Formulas (a1) to (a4) is from 1 to 99 mol % or from 5 to 95 mol %, based on a total amount of the monomer units constituting the resin.

[4] The photoresist resin according to any one of [1] to [3], containing at least one polymerization unit selected from the group consisting of polymerization units represented by Formulas (b1) to (b5), where R represents a hydrogen atom, a halogen atom, or an alkyl group that has from 1 to 6 carbon atoms and may have a halogen atom; A represents a single bond or a linking group; X represents no bond, a methylene group, an ethylene group, an oxygen atom, or a sulfur atom; Y represents a methylene group or a carbonyl group; Z represents a divalent organic group; $V^1$ to $V^3$ are the same or different and represent —$CH_2$—, [—C(=O)—], or [—C(=O)—O—] with the proviso that at least one of $V^1$ to $V^3$ is [—C(=O)—O—]; and $R^8$ to $R^{14}$ are the same or different and represent a hydrogen atom, a fluorine atom, an alkyl group that may have a fluorine atom, a hydroxy group that may be protected with a protecting group, a hydroxyalkyl group that may be protected with a protecting group, a carboxy group that may be protected with a protecting group, or a cyano group.

[5] The photoresist resin according to [4], wherein a content of at least one polymerization unit selected from the group consisting of the polymerization units represented by Formulas (b1) to (b5) is from 1 to 99 mol % or from 5 to 95 mol %, based on a total amount of the monomer units constituting the resin.

[6] The photoresist resin according to any one of [2] to [5], further containing a polymerization unit represented by Formula (c1), where R represents a hydrogen atom, a halogen atom, or an alkyl group that has from 1 to 6 carbon atoms and may have a halogen atom; A represents a single bond or a linking group; $R^b$ represents a hydroxy group that may be protected with a protecting group, a hydroxyalkyl group that may be protected with a protecting group, a carboxy group that may be protected with a protecting group, or a cyano group; q represents an integer from 1 to 5; and a ring $Z^2$ represents an alicyclic hydrocarbon ring having from 6 to 20 carbon atoms.

[7] The photoresist resin according to [6], wherein a content of a polymerization unit represented by Formula (c1) is from 1 to 99 mol % or from 5 to 95 mol %, based on the total amount of the monomer units constituting the resin.

[8] The photoresist resin according to any one of [1] to [7], wherein a weight average molecular weight (Mw) is from 1000 to 50000 or from 3000 to 20000.

[9] The photoresist resin according to any one of [1] to [8], wherein a molecular weight distribution (ratio of the weight average molecular weight and a number average molecular weight: Mw/Mn) is 3.5 or less, from 1.1 to 3.0, or from 1.2 to 2.5.

[10] The photoresist resin according to any one of [1] to [9], wherein an acid value is 0.10 mmol/g or less, 0.05 mmol/g or less, or 0.03 mmol/g or less.

[11] A production method for the photoresist resin described in any one of [1] to [10], the production method including:
adding dropwise a monomer or a solution containing the monomer in the presence of a polymerization initiator to polymerize the monomer; and
adding a polymerization inhibitor of from 10 ppm or greater, from 50 to 2000 ppm, from 100 to 1000 ppm, or from 200 to 500 ppm to a resin solid content contained in a reaction solution after the polymerization step.

[12] The production method for the photoresist resin according to [11], wherein the polymerization inhibitor is at least one selected from the group consisting of hydroquinones, phenols, benzoquinones, and the like, and N-oxyl compounds.

[13] A photoresist resin composition containing at least the photoresist resin described in any one of [1] to [12] and a radiation-sensitive acid generating agent.

[14] A pattern formation method including at least applying the photoresist resin composition described in [13] to a substrate to form a coating film, exposing the coating film, and then dissolving the coating film with an alkali.

INDUSTRIAL APPLICABILITY

The resin of an embodiment of the present invention exhibits high resist performance because a poorly soluble component with respect to a resist solvent is reduced. Since the composition of an embodiment of the present invention contains the resin in which the poorly soluble component with respect to the resist solvent is reduced, high resist performance can be exhibited, and a fine pattern can be formed with good precision by using the composition.

The invention claimed is:

1. A photoresist resin comprising an acrylic resin, wherein
when the photoresist resin is dissolved in propylene glycol monomethyl ether acetate in such a way that a resin solid content concentration is 5 wt %, a polystyrene equivalent turbidity measured using a method described in "Drinking Water Testing Methods" of Japan Water Works Association of 2003, Ministry of Health, Labor and Welfare Ordinance No. 261 of Japan is 30 or less,
wherein the photoresist resin comprises at least one polymerization unit selected from the group consisting of polymerization units represented by Formulas (a2) to (a4) and (b1) to (b5)

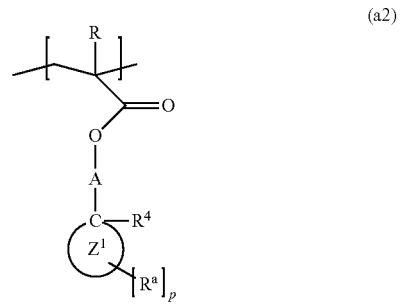

(a2)

(a3)

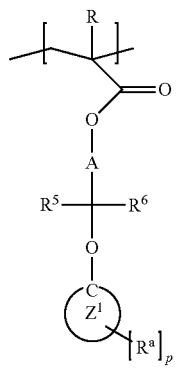

(a4)

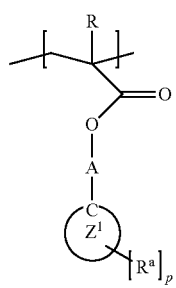

(b1)

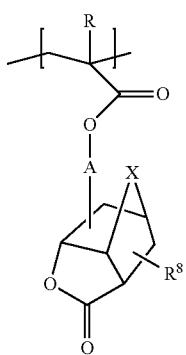

(b2)

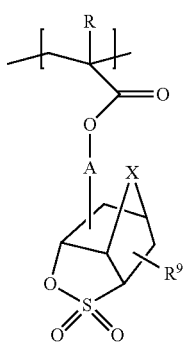

(b3)

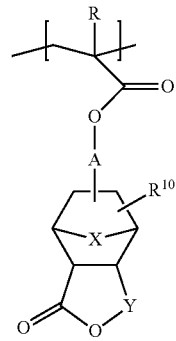

(b4)

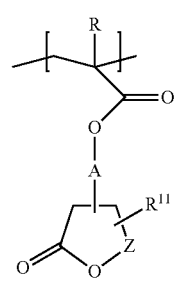

(b5)

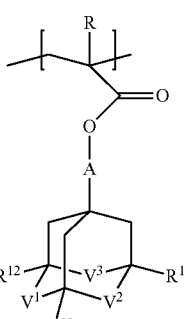

wherein R represents a hydrogen atom, a halogen atom, or an alkyl group that has from 1 to 6 carbon atoms and optionally has a halogen atom; A represents a single bond or a linking group; R4 represents a branched alkyl group that has from 1 to 6 carbon atoms; $R^5$ and $R^6$ are the same or different and represent an alkyl group that has from 1 to 6 carbon atoms and optionally has a hydrogen atom or a substituent; $R^7$ represents a —COORe group, and the $R^c$ represents a tertiary hydrocarbon group that optionally has a substituent, a tetrahydrofuranyl group, a tetrahydropyranyl group, or an oxepanyl group; n represents an integer from 1 to 3; $R^a$ represents a substituent bonded to a ring $Z^1$, and each $R^a$ is the same or different and represents an oxo group, an alkyl group, a hydroxy group optionally protected with a protecting group, a hydroxyalkyl group optionally protected with a protecting group, or a carboxy group optionally protected with a protecting group; p of the polymerization units represented by Formulas (a2) represents an integer from 0 to 3; p of the polymerization units represented by Formulas (a3) represents an integer from 0 to 3; p of the polymerization units represented by Formulas (a4) represents an integer from 1 to 3; the ring $Z^1$ of the polymerization units represented by Formulas (a2) represents a cycloalkane ring having from 3 to 20 carbon atoms; the ring $Z^1$ of the polymerization units represented by Formulas (a3)

represents an alicyclic hydrocarbon ring having from 3 to 20 carbon atoms; and the ring $Z^1$ of the polymerization units represented by Formulas (a4) represents an alicyclic hydrocarbon ring having from 3 to 20 carbon atoms; X represents no bond, a methylene group, an ethylene group, an oxygen atom, or a sulfur atom; Y represents a methylene group or a carbonyl group; Z represents a divalent organic group; $V^1$ to $V^3$ are the same or different and represent —$CH_2$—, [—C(=O)—], or [—C(=O)—O—] with the proviso that at least one of $V^1$ to $V^3$ is [—C(=0)—O—]; and $R^9$ and $R^{11}$ are the same or different and represent a hydrogen atom, a fluorine atom, an alkyl group optionally having a fluorine atom, a hydroxy group optionally protected with a protecting group, a hydroxyalkyl group optionally protected with a protecting group, a carboxy group optionally protected with a protecting group, or a cyano group; $R^8$ represents a cyano group; $R^9$ and $R^{12}$ to $R^{14}$ are the same or different and represent a fluorine atom, an alkyl group optionally having a fluorine atom, or a cyano group; and $R^{10}$ represents a fluorine atom, an alkyl group optionally having a fluorine atom, a hydroxy group optionally protected with a protecting group, a hydroxyalkyl group optionally protected with a protecting group, a carboxy group optionally protected with a protecting group, or a cyano group.

2. The photoresist resin according to claim 1, further comprising a polymerization unit represented by Formula (c1)

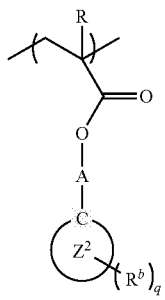

(c1)

wherein R represents a hydrogen atom, a halogen atom, or an alkyl group that has from 1 to 6 carbon atoms and optionally has a halogen atom; A represents a single bond or a linking group; $R^b$ represents a hydroxy group optionally protected with a protecting group, a hydroxyalkyl group optionally protected with a protecting group, a carboxy group optionally protected with a protecting group, or a cyano group; q represents an integer from 1 to 5; and a ring $Z^2$ represents an alicyclic hydrocarbon ring having from 6 to 20 carbon atoms.

3. A photoresist resin composition comprising at least the photoresist resin described in claim 1 and a radiation-sensitive acid generating agent.

4. A production method for the photoresist resin described in claim 1, the production method comprising:
adding dropwise a monomer or a solution containing the monomer in the presence of a polymerization initiator to polymerize the monomer; and
adding a polymerization inhibitor of 10 ppm or greater to a resin solid content contained in a reaction solution after the polymerization step.

5. The production method for the photoresist resin according to claim 4, wherein the polymerization inhibitor is at least one selected from the group consisting of hydroquinones, phenols, benzoquinones, and the like, and N-oxyl compounds.

6. A pattern formation method comprising at least applying the photoresist resin composition described in claim 3 to a substrate to form a coating film, exposing the coating film, and then dissolving the coating film with an alkali.

7. The production method for the photoresist resin described in claim 2, the production method comprising:
adding dropwise a monomer or a solution containing the monomer in the presence of a polymerization initiator to polymerize the monomer; and
adding a polymerization inhibitor of 10 ppm or greater to a resin solid content contained in a reaction solution after the polymerization step.

8. The production method for the photoresist resin according to claim 7, wherein the polymerization inhibitor is at least one selected from the group consisting of hydroquinones, phenols, benzoquinones, and the like, and N-oxyl compounds.

* * * * *